United States Patent
Tobita

(10) Patent No.: US 7,034,571 B2
(45) Date of Patent: Apr. 25, 2006

(54) LEVEL CONVERTING CIRCUIT EFFICIENTLY INCREASING AN AMPLITUDE OF A SMALL-AMPLITUDE SIGNAL

(75) Inventor: Youichi Tobita, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 37 days.

(21) Appl. No.: 10/836,266

(22) Filed: May 3, 2004

(65) Prior Publication Data

US 2004/0257111 A1    Dec. 23, 2004

(30) Foreign Application Priority Data

Jun. 17, 2003    (JP) .............................. 2003-172183

(51) Int. Cl.
  H03K 19/0175    (2006.01)
  H03K 19/094    (2006.01)

(52) U.S. Cl. ........................... 326/68; 326/81; 327/333

(58) Field of Classification Search .................. 326/63, 326/68, 81, 80; 327/333
See application file for complete search history.

(56) References Cited

U.S. PATENT DOCUMENTS

| | | | |
|---|---|---|---|
| 3,506,851 A | 4/1970 | Polkinghorn et al. | |
| 3,710,271 A | 1/1973 | Putnam | |
| 3,898,479 A | 8/1975 | Proebsting | |
| 6,504,418 B1 * | 1/2003 | Coughlin, Jr. | 327/319 |
| 6,650,167 B1 * | 11/2003 | Benzer et al. | 327/333 |

FOREIGN PATENT DOCUMENTS

| | | | |
|---|---|---|---|
| JP | 62157419 A | * | 7/1987 |
| JP | 10-64287 | | 3/1998 |
| JP | 2002-328643 | | 11/2002 |

* cited by examiner

*Primary Examiner*—Daniel Chang
(74) *Attorney, Agent, or Firm*—Oblon, Spivak, McClelland, Maier & Neustadt, P.C.

(57) ABSTRACT

A gate of an N-channel MOS transistor driving an output node is driven through a capacitance element in accordance with an input signal. A voltage on a source node of the drive transistor is applied as an output signal to an output node. Consequently, it is possible to perform level conversion of a voltage at a low level of the input signal having a higher voltage than the source node voltage of the drive transistor. It is thus possible to achieve a level converting circuit that can reduce the number of manufacturing steps, and can perform the level conversion of any logical level of the input signal.

15 Claims, 12 Drawing Sheets

LEVEL CONVERTING CIRCUIT EFFICIENTLY INCREASING AN AMPLITUDE OF A SMALL-AMPLITUDE SIGNAL

BACKGROUND OF THE INVENTION

1. Field of the Invention

The present invention relates to a level converting circuit for converting an amplitude of a signal, and particularly to a level converting circuit using an insulated gate field effect transistor of a single conductivity type.

2. Description of the Background Art

In conventional semiconductor devices, there has been widely employed a CMOS circuit formed of a P-channel MOS transistor (insulated gate field effect transistor) and a N-channel MOS transistor. Based on characteristics of threshold voltages of the MOS transistors, it is general in the CMOS circuit to turn on the P-channel MOS transistor when a signal at an H level (logically high level) is to be output, and to turn on the N-channel MOS transistor when a signal at an L level (logically low level) is to be output. In the CMOS circuit, charging/discharging current flows when an output signal of the CMOS circuit changes, but no current flows when the output signal is stable, so that power consumption can be made small.

There are some cases that an internal voltage at a level different from a power supply voltage and a ground voltage is used in semiconductor devices. When the internal voltage is higher than the power supply voltage or is lower than the ground voltage, a signal changing between the power supply voltage and the ground voltage must be converted to a signal changing between the internal voltage and the ground voltage, between the power supply voltage and the internal voltage, or between first and second internal voltages, and a level converting circuit is required for such conversion.

When the level converting circuit is formed of a CMOS circuit, P- and N-channel MOS transistors must be used, resulting in an increased number of manufacturing steps. In order to avoid such increase, a level converting circuit may be formed of a single kind of MOS transistors, as is disclosed in Japanese Patent Laying-Open No. 2002-328643, for example.

The level converting circuit disclosed in the above prior art reference converts a signal changing between a ground voltage and a power supply voltage to a signal changing between the ground voltage and an internal voltage VDD2 higher than power supply voltage VDD1. The level converting circuit disclosed in the above prior art reference includes an input stage formed of an N-channel MOS transistor connected in series to a diode-connected load element and having a gate receiving an input signal, a push-pull output stage formed of N-channel MOS transistors connected in series between an internal voltage supply node and a ground node, and a capacitance element connected between an output node of the push-pull output stage and an output node of the input stage. A MOS drive transistor on a high side of the output stage has a gate coupled to the output node of the input stage, and an input signal is supplied to a gate of a MOS drive transistor on a low side of the output stage.

The capacitance element is utilized as a bootstrapping capacitance. It is now assumed that the input signal is at the low level, the drive transistor in the input stage is off, and the drive transistor on the low side in the output signal is off. In this state, when the voltage level of the output signal applied from the output stage rises in accordance with the input signal, a bootstrapping effect of the capacitance element raises the gate voltage of the high-side MOS drive transistor in the output stage to a level higher than internal voltage VDD2, to produce a signal at a level of the voltage VDD2.

When the input signal is at the high level, the low-side MOS transistor in the output stage drives the output signal to the ground voltage level. In this operation, the output signal of the input stage attains a low level of a voltage level determined by on-resistances of the diode-connected load MOS transistor and the drive transistor, and the high-side MOS drive transistor in the output stage turns non-conductive.

In the above prior art reference, only N-channel MOS transistors are used in the level converting circuit for the purpose of eliminating steps of forming P-channel MOS transistor, to reduce the number of manufacturing steps.

In the structure of the level converting circuit disclosed in the above prior art reference, the high-side MOS drive transistor in the output stage has the gate set to the electrically floating state, and through the bootstrapping operation of the capacitance element, the voltage level of the gate raised to produce a signal at the high level of voltage VDD2 higher than the high-level voltage VDD1 of the input signal. Both low-level voltages of the input signal and the output signal are equal to the ground voltage. The drive transistor in the input stage and the low-side MOS driver transistor in the output stage are commonly supplied with the input-signal, so that the level conversion of the input signal to the high-level voltage can be performed.

However, when N-channel MOS transistor is used, the low level of the output signal cannot be made lower than the ground voltage. If the low-side MOS transistor in the output stage is coupled to a negative voltage supply instead of the ground node, the low-side MOS drive transistor in the output stage does not turn non-conductive even when its gate attains the level of ground voltage. Consequently, a through-current flows in the output stage, and the voltage of output signal at the high level lowers.

If a signal at a low level of a negative voltage lower than the ground voltage is to be produced, in the structure of the foregoing prior art reference, voltage polarities are made inverted, and the MOS transistors are formed of P-channel transistors. In this case, however, the high-level voltages of the input and output signals are both equal to the power supply voltage.

In the structure of the foregoing prior art reference, therefore, the low-level voltage of the input signal could not be converted to a voltage lower than the low-level voltage with only the N-channel MOS transistors. Likewise, it is impossible to produce an output signal having a high-level voltage higher than the high-level voltage of the input signal with only P-channel MOS transistors.

In addition, in the structure of the foregoing prior art reference, both the high- and low-level voltages of the input signal could not be converted with a common circuit structure.

SUMMARY OF THE INVENTION

An object of the invention is to provide a level converting circuit capable of easily effecting voltage level conversion of both logical levels of a signal voltage, with MOS transistors of a single kind.

Another object of the invention is to provide a level converting circuit capable of converting a low-level voltage to a voltage at a further lower level, with only N-channel MOS transistors.

Still another object of the invention is to provide a level converting circuit capable of converting a high-level voltage to a further higher voltage, with only P-channel MOS transistors.

A level converting circuit according to the invention is a level converting circuit having first and second power supplies and converting an input signal having an amplitude smaller than a voltage difference between the first and second power supplies to a signal changing between voltage levels corresponding to the voltages of the first and second power supplies, and includes a first MOS transistor coupled between an output node and the first power supply; a first capacitance element coupled between a node receiving the input signal and a gate of the first MOS transistor; a first current driving element coupled between the gate of the first MOS transistor and the first power supply, and a second current driving element coupled between the second power supply and the output node.

Through capacitance coupling or a charge pump operation of the capacitance element, a gate potential of the first MOS transistor changes with an amplitude of the input signal with reference to a voltage level of the first power supply. Therefore, the first MOS transistor can be reliably set to the conductive/non-conductive states in accordance with the input signal, and the logical level of the input signal corresponding to the first power supply voltage can be converted to the level of the first power supply voltage.

For example, if the first MOS transistor is an N-channel MOS transistor and the first power supply voltage is a negative voltage, the gate voltage of the first MOS transistor changes between the negative voltage and a voltage higher than the negative voltage. Therefore, when the input signal is at the high level, the first MOS transistor turns conductive to produce an output signal at a negative voltage level. When the input signal is at the low level, the gate of the first MOS transistor attains a low level of the negative voltage, and the first MOS transistor turns non-conductive, so that the second current driving element can bring the output signal to the high level.

If the first MOS transistor is a P-channel MOS transistor, the gate potential of the first MOS transistor is changed, by the capacitance element, between a level of the first power supply voltage and a level lower than the first power supply voltage, and the first MOS transistor can be reliably set to the conductive/non-conductive states in accordance with the input signal. When the input signal is at the low level, the gate potential of the first MOS transistor attains the low level, and the first MOS transistor turns conductive, so that a signal at the level of the first power supply voltage is produced as the output signal.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[First Embodiment]

Figure 1:
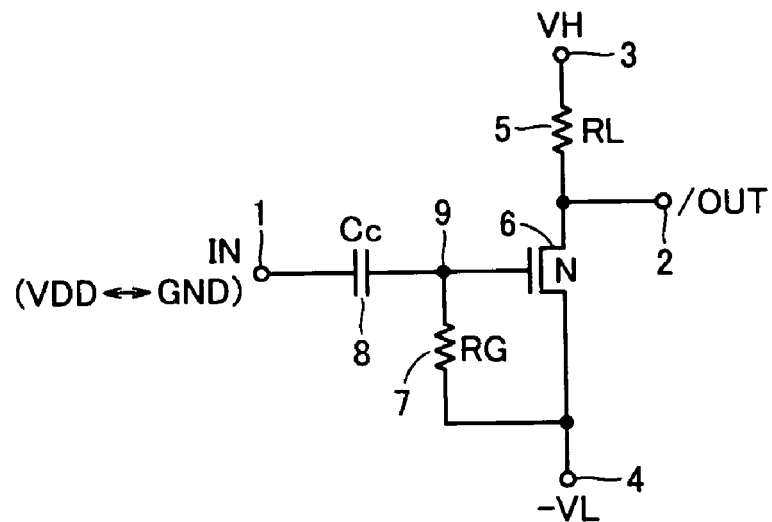
FIG. 1 shows a structure of a level converting circuit according to a first embodiment of the invention.

FIG. 1 shows a configuration of a level converting circuit according to a first embodiment of the invention. The level converting circuit shown in FIG. 1 produces, from a signal IN changing between a high level of a voltage VDD and a low level of a reference voltage GND, a signal /OUT changing between a high level of a positive voltage VH higher than voltage VDD and a low level of a negative voltage, −VL, lower than reference voltage GND. Voltage VDD and positive voltage VH may be equal in level to each other, or may be different in level from each other. Reference voltage GND provides a measurement reference level for various voltages, and is usually at a ground voltage level.

In FIG. 1, the level converting circuit includes a resistance element 5 connected between a high-side power supply node 3 and an output node 2, an N-channel MOS transistor 6 connected between output node 2 and a negative power supply node (low-side power supply node) 4, a capacitance element 8 connected between a signal input node 1 and a gate node 9 of a MOS transistor 6, and a resistance element 7 connected between a gate node 9 and low-side power supply node 4.

High-side power supply node 3 is supplied with positive voltage VH, and low-side power supply node 4 is supplied with negative voltage −VL.

Resistance element 5 has a resistance value RL, and resistance element 7 has a resistance value RG. These resistance elements 5 and 7 function as current driving elements. Capacitance element 8 has a capacitance value Cc.

Input signal IN changes between voltage VDD and reference voltage GND. Output signal /OUT is produced on output node 2 as an inverted signal of input signal IN.

Figure 2:
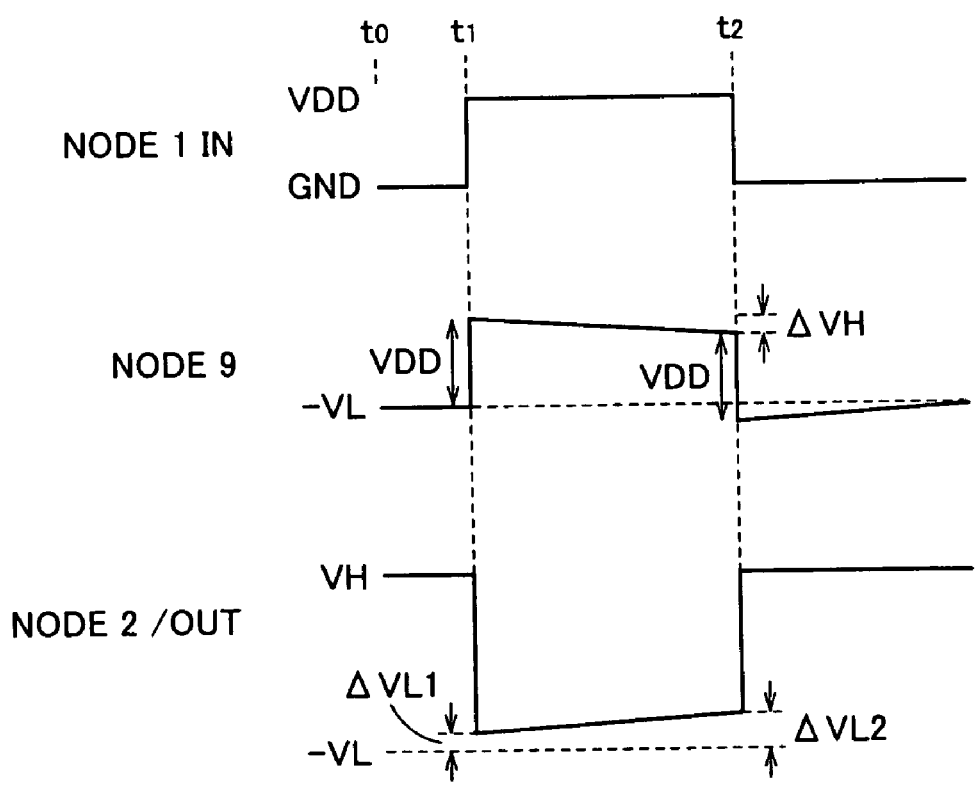
FIG. 2 is a signal waveform diagram illustrating an operation of the level converting circuit shown in FIG. 1.

FIG. 2 is a signal waveform diagram illustrating an operation of the level converting circuit shown in FIG. 1. Referring to FIG. 2, an operation of the level converting circuit shown in FIG. 1 will now be described.

It is assumed that at a time t0, the level converting circuit is in a steady state, and input signal IN applied to input node 1 is at the level of reference voltage GND. In this case, resistance element 7 maintains gate node 9 at the level of negative voltage −VL, and MOS transistor 6 has the gate and source potentials made equal to each other, and thus is non-conductive. In this state, output signal /OUT from output node 2 is at the level of positive voltage VH due to charging from high-side power supply node 3 through resistance element 5.

At a time t1, input signal IN applied to input node 1 rises from the level of reference voltage GND to the level of voltage VDD. This voltage change is transmitted to gate node 9 through capacitance element 8. Since parasitic capacitances such as a gate capacitance of MOS transistor 6 and a line capacitance of gate node 9 are present at gate node 9, these parasitic capacitances lower the level of the voltage coupled to gate node 9 by capacitance element 8. It is assumed here that capacitance value Cc of capacitance element 8 is sufficiently large as compared to the parasitic capacitances, and the potential change of voltage VDD is transmitted to gate node 9.

It is also assumed that a time constant determined by a product of resistance value RG of resistance element 7 and capacitance value Cc of capacitance element 8 is sufficiently larger than a time period of the high level of input signal IN. In this case, the voltage level of gate node 9 rises from negative voltage −VL by voltage VDD, and gradually lowers in accordance with the time constant determined by resistance element 7 and capacitance element 8.

At time t1, the voltage VDD is applied between the gate and source of MOS transistor 6 as a result of the voltage rising of gate node 9. Assuming that the threshold voltage of the MOS transistor is sufficiently lower than the voltage VDD, the MOS transistor turns conductive, and the voltage level of output node 2 lowers to (−VL+ΔVL1), where voltage ΔVL1 is an output offset voltage determined by a ratio between resistance element 5 and the on-resistance of MOS transistor 6. Therefore, when the voltage level of gate node 9 lowers through the discharging by resistance element 7, the on-resistance of MOS transistor 6 increases, so that output offset voltage ΔVL1 increases.

At a time t2, input signal IN lowers from voltage VDD to reference voltage GND. This voltage change is transmitted to gate node 9 through capacitance element 8, and the voltage on gate node 9 lowers by the voltage VDD. At time t2, the voltage level of gate node 9 is lower than that at time t1 by a voltage ΔVH due to the discharging through resistance element 7, and the voltage level of gate node 9 attains a level lower than negative voltage −VL. Responsively, MOS transistor 6 turns non-conductive, and output node 2 is charged by resistance element 5 to attain the voltage level of positive voltage VH again.

At a time t2, the voltage level of output node 2 rises from (−VL+ΔVL2) to positive voltage VH. This is because the on-resistance of MOS transistor 6 gradually increases in accordance with the lowering of its gate potential, and accordingly, the output offset voltage level rises.

Voltages ΔVH and ΔVL2 are set such that both the high and low levels of output signal /OUT from output node 2 are outside the range of the input logical threshold voltage of a circuit in a subsequent stage. Thus, input signal IN changing between voltages VDD and GND can be converted to a signal changing between voltages VH and (ΔVH2−VL).

Voltage ΔVH is determined by capacitance value Cc of capacitance element 8, resistance value RG of resistance element 7 and a high-level time period of input signal IN. Voltage VL2 is determined by a channel resistance in the state when the gate to source voltage of MOS transistor 6 is equal to (VDD−ΔVH), as well as resistance value RL of resistance element 5. By appropriately selecting these parameters, it is possible to make adequately the voltages ΔVH and ΔVL2 small.

[First Modification]

Figure 3A:
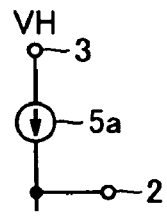
FIGS. 3A and 3B show, by way of example, modifications of resistance elements shown in FIG. 1.

FIG. 3A shows a modification of resistance element 5 shown in FIG. 1. In FIG. 3A, resistance element 5 is replaced with a constant current source 5a that has a current driving capability substantially equal to that of resistance element 5, and is connected between high-side power supply node 3 and output node 2.

Figure 3B:
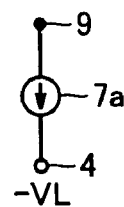

FIG. 3B shows a modification of resistance element 7. In a structure shown in FIG. 3B, resistance element 7 is replaced with a constant current source 7a that has a current driving capability substantially equal to that of resistance element 7, and is connected between gate node 9 and low-side power supply node 4.

According to the structures shown in FIGS. 3A and 3B, resistance elements 5 and 7 in the level converting circuit shown in FIG. 1 are replaced with constant current supplies 5a and 7a, respectively. In this case, the rising speed of output signal /OUT can be accurately set by the driving current of constant current source 5a. The low level of output signal /OUT is determined in accordance with a current supplied by constant current source 5a and the on-resistance of MOS transistor 6. Also, the discharging speed of gate node 9 can be accurately set by constant current source 7a. Accordingly, when an amount of the driving current of constant current source 7a is made adequately small, the amount ΔVH of potential lowering of gate node 9 can be adequately small.

[Modification 2]

Figure 4A:
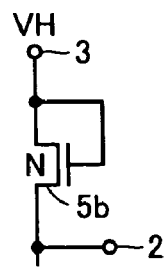
FIGS. 4A and 4B show, by way of example, further modifications of the resistance elements shown in FIG. 1.

FIG. 4A shows another modification of resistance element 5 shown in FIG. 1. In FIG. 4A, resistance element 5 is replaced with an N-channel MOS transistor 5b that has a drain and a gate both coupled to high-side power supply node 3, and operates in a resistance mode.

Figure 4B:
Figure 7:
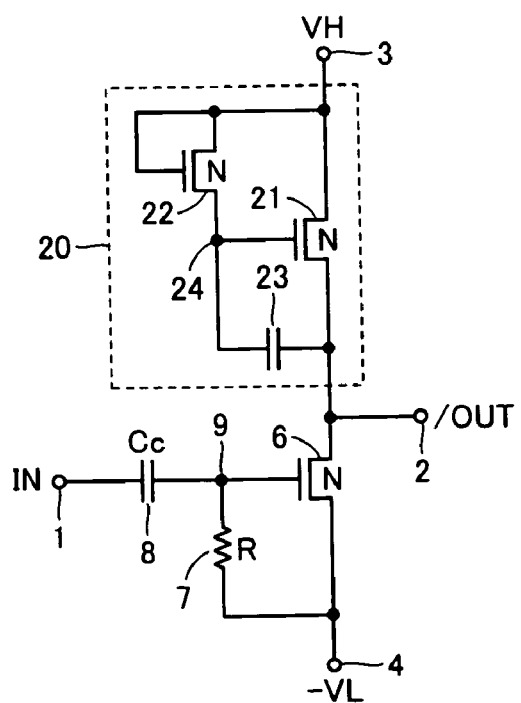
FIG. 7 shows a configuration of a level converting circuit according to a third embodiment of the invention.

FIG. 4B shows another modification of resistance element 7 shown in FIG. 7. In FIG. 4B, resistance element 7 is replaced with an N-channel MOS transistor 7b that has a gate and a drain connected to gate node 9, and operates in a resistance mode.

These MOS transistors 5b and 7b operate in a saturation region, and functions as resistance elements by their on-resistances. The current driving capability of MOS transistors 5b and 7b are made substantially equal to those of resistance elements 5 and 7, so that a current driving element with a reduce occupation area and a limited driving current, can be implemented.

MOS transistor 6 and MOS transistors 5b and 7b can be produced through the same manufacturing process steps, so that the number of manufacturing steps can be reduced.

According to the first embodiment of the invention, as described above, the gate potential of the N-channel MOS drive transistor driving the output signal to the low level is changed through the capacitance coupling in accordance with the input signal, and thus the low-level voltage of the input signal can be converted to a further lower voltage level.

[Second Embodiment]

Figure 5:
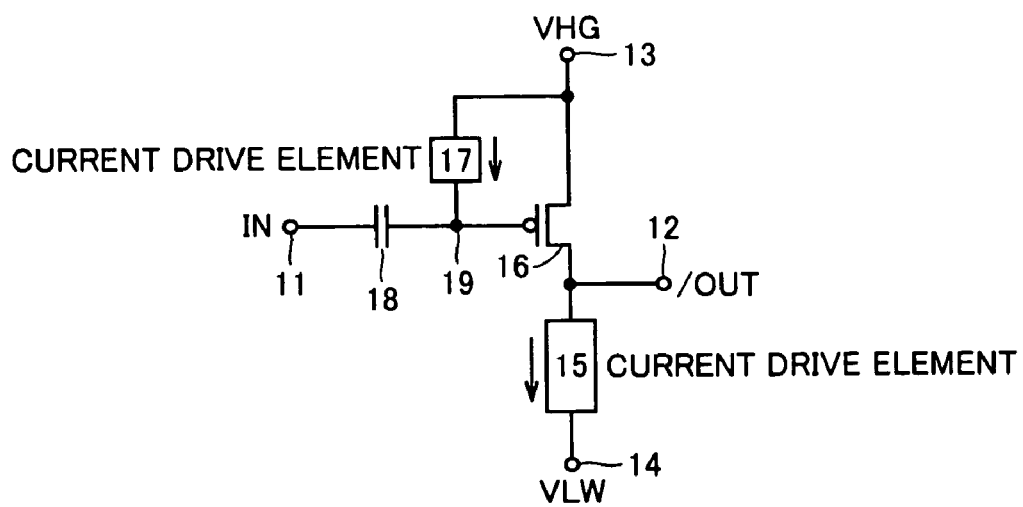
FIG. 5 schematically shows a configuration of a level converting circuit according to a second embodiment of the invention.

FIG. 5 shows a configuration of a level converting circuit according to a second embodiment of the invention. In FIG. 5, the level converting circuit includes a P-channel MOS transistor 16 connected between a high-side power supply node 13 and an output node 12, a current drive element 15 connected between output node 12 and a low-side power supply node 14, a current drive element 17 connected between high-side power supply node 13 and a gate node 19 of MOS transistor 16, and a capacitance element 18 connected between an input node 11 receiving input signal IN and gate node 19.

Input signal IN changes between the voltage VDD and reference voltage GND, as in to the first embodiment. High-side power supply node 13 receives a voltage VHG, and low-side power supply node 14 receives a voltage VLW. High-side power supply voltage VHG is higher than high-level voltage VDD of input signal IN. Low-side power supply voltage VLW may be reference voltage GND or may be lower than reference voltage GND. Further, low-side power supply voltage VLW may be higher than reference voltage GND.

Each of current drive elements 15 and 17 is formed of a resistance element, a constant current source or a P-channel MOS transistor operating in a resistance mode.

Figure 6:
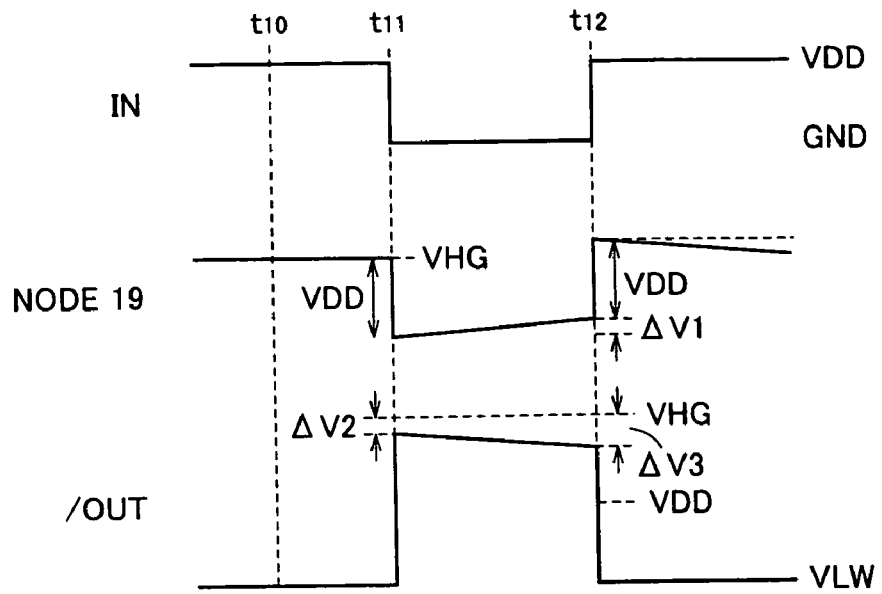
FIG. 6 is a signal waveform diagram illustrating an operation of the level converting circuit shown in FIG. 5.

FIG. 6 is a signal waveform diagram illustrating an operation of the level converting circuit shown in FIG. 5. Referring to FIG. 6, the operation of the level converting circuit shown in FIG. 5 will now be described.

It is assumed that at a time t10, input signal IN is at the level of voltage VDD, gate node 19 is at the level of voltage VHG, and output signal /OUT generated from output node 12 is at the level of voltage VLW.

At a time t11, input signal IN falls from voltage VDD to reference voltage GND, and the potential change of input signal IN is transmitted to gate node 19 through capacitance element 18, and the voltage level of node 19 lowers from voltage VHG to a voltage of (VHG−VDD). A parasitic capacitance of gate node 19 is neglected. If the voltage VDD is sufficiently higher than the absolute value of the threshold voltage of MOS transistor 16, the gate-source voltage of MOS transistor 16 is lower than the threshold voltage thereof, so that MOS transistor 16 turns conductive to supply a current to output node 12, and accordingly, the voltage level of output signal /OUT rises.

The high level of output signal /OUT is lower than voltage VHG by an output offset voltage ΔV2. Output offset voltage ΔV2 is determined by the on-resistance of MOS transistor 16 as well as an amount of current driven by current drive element 15 or a resistance value thereof. After the voltage level of gate node 19 lowers by VDD in accordance with the fall of input signal IN, current drive element 17 supplies a current from high-side power supply node 13, and the voltage level of gate node 19 rises. In accordance with the rising of voltage level of gate node 19, the on-resistance of MOS transistor 16 increases, and the voltage level of output signal /OUT lowers.

The amounts of drive current or the resistance values of current drive elements 15 and 17 as well as the on-resistance of the MOS transistor are set such that the potential change of gate node 19 and the potential change of output signal /OUT can be substantially neglected over a time period of L-level of input signal IN. These conditions are similar to those in the first embodiment.

At a time t12, input signal IN rises from the level of reference voltage GND to the level of voltage VDD. In accordance with the voltage rising of input signal IN, the potential of gate node 19 rises from the voltage of (VHG−VDD+ΔV1) by voltage VDD. In accordance with the potential rising of gate node 19, MOS transistor 16 turns nonconductive, and current drive element 15 discharges output node 12, and accordingly, the voltage level of output node 12 falls to the level of low-side power supply voltage VLW. Before the falling at time t12, MOS transistor 16 has the on-resistance increased in accordance with the potential rising of gate node 19 due to the current supplied from current drive element 17, and accordingly, output signal /OUT is at a lowered level of voltage of (VHG−ΔV3).

When the level converting circuit shown in FIG. 5 is utilized, the high-level voltage VDD of input signal IN can be raised to the voltage level corresponding to the voltage VHG higher than high-level voltage VDD, and output signal /OUT having a high-level voltage of (VHG−ΔV3) larger than VDD can be produced. In particular, when output signal /OUT sufficiently changes into the high and low sides exceeding the input logical threshold of a circuit in a succeeding stage of the output node 12 of the level converting circuit, the level converting circuit shown in FIG. 5 can be utilized as the level converting circuit for converting the high-level voltage.

According to the second embodiment of the invention, as described above, the gate potential of the P-channel MOS transistor driving the output signal to the high level is changed through the capacitance coupling in accordance with the input signal, and the signal having a high-level voltage higher than the high-level voltage of the input signal can be produced by using only the P-channel MOS transistors as the MOS transistors.

[Third Embodiment]

FIG. 7 shows a configuration of a level converting circuit according to a third embodiment of the invention. In the level converting circuit shown in FIG. 7, a bootstrapping type load circuit 20 is used, in place of resistance element 5 in the level converting circuit shown in FIG. 1. The bootstrapping type load circuit 20 includes an N-channel MOS transistor 21 connected between high-side power supply node 3 and output node 2, an N-channel MOS transistor 22 that has a gate and a drain connected to the high-side power supply node and has a source connected to a gate node 24 of MOS transistor 21, and a capacitance element 23 connected between output node 2 and node 24.

MOS transistor 22, when conductive, charges node 24 to a voltage level of (VH−Vthn), where Vthn represents a threshold voltage of MOS transistor 22. Other configuration of the level converting circuit shown in FIG. 7 is the same as in the level converting circuit shown in FIG. 1. Corresponding portions are allotted with the same reference numerals, and description thereof will not be repeated.

A timing relationship between input signal IN and output signal /OUT of the level converting circuit shown in FIG. 7 is essentially the same as that illustrated in FIG. 2.

In the level converting circuit shown in FIG. 7, when input signal IN is at a high level of voltage VDD, gate node 9 is at the level of voltage of (VDD−VL) so that MOS transistor 6 is conductive, and output signal /OUT generated from output node 2 attains the low level corresponding to the level of voltage −VL.

In this state, the source node of MOS transistor 21 in bootstrapping type load circuit 20 is at the side of output node 2. Even when the potential of node 24 lowers by capacitance element 23 in accordance with the potential lowering of output node 2, MOS transistor 22 is conductive, and thus sets the gate potential of MOS transistor 21 to the voltage of (VH−Vthn). Usually, a voltage of (VH−Vthn−(−VL)) is higher than a threshold voltage of MOS transistor 21. Therefore, MOS transistor 21 is made conductive, and output signal /OUT attains the voltage level determined by the current drive capabilities (on-resistances) of MOS transistors 21 and 6. When the current driving capability (or on-resistance) of MOS transistor 21 is made sufficiently smaller than the current driving capability (or on-resistance) of MOS transistor 6, output signal /OUT can be set to the voltage level sufficiently close to voltage −VL.

When input signal IN falls from the level of voltage VDD to the level of reference voltage GND, the voltage level of gate node 9 lowers, and MOS transistor 6 turns non-conductive. In this state, MOS transistor 21 charges output node 2 to raise its voltage level. When the voltage level of output node 2 rises, this voltage rising is transmitted to node 24 through capacitance element 23. When the voltage level of node 24 exceeds the voltage of (VH−Vthn), MOS transistor 22 turns non-conductive, and node 24 enters a floating state. Therefore, in accordance with the rising of output signal /OUT generated from output node 2, the voltage level of node 24 further rises from the voltage of (VH−Vthn). When the voltage level of node 24 exceeds the voltage of (VH+Vthn), MOS transistor 21 supplies voltage VH to output node 2, and output signal /OUT attains the level of voltage VH.

Through the bootstrapping operation of capacitance element 23, MOS transistor 21 can be quickly set to a deep on-state, and output signal /OUT can be raised more quickly than that in a configuration utilizing resistance elements or others.

In an operation of falling of output signal /OUT from the high level to the low level, MOS transistor 22 in bootstrapping type load circuit 20 is initially in a non-conductive state, and accordingly, node 24 can be lowered in voltage level through the capacitance coupling of capacitance element 23. Accordingly, the voltage level of node 24 quickly lowers to the voltage level of (VH−Vthn), and MOS transistor 21 has a sufficiently reduced current driving capability (or a sufficiently decreased on-resistance). Thus, MOS transistor 6 can quickly discharge the output node 2.

Accordingly, by utilizing the bootstrapping type load circuit 20 shown in FIG. 7, it is possible to implement the level converting circuit that can quickly change output signal /OUT.

In particular, the level converting circuit shown in FIG. 7 can achieve a higher rising rate of output signal /OUT than the level converting circuit shown in FIG. 1.

[Modification]

Figure 8:
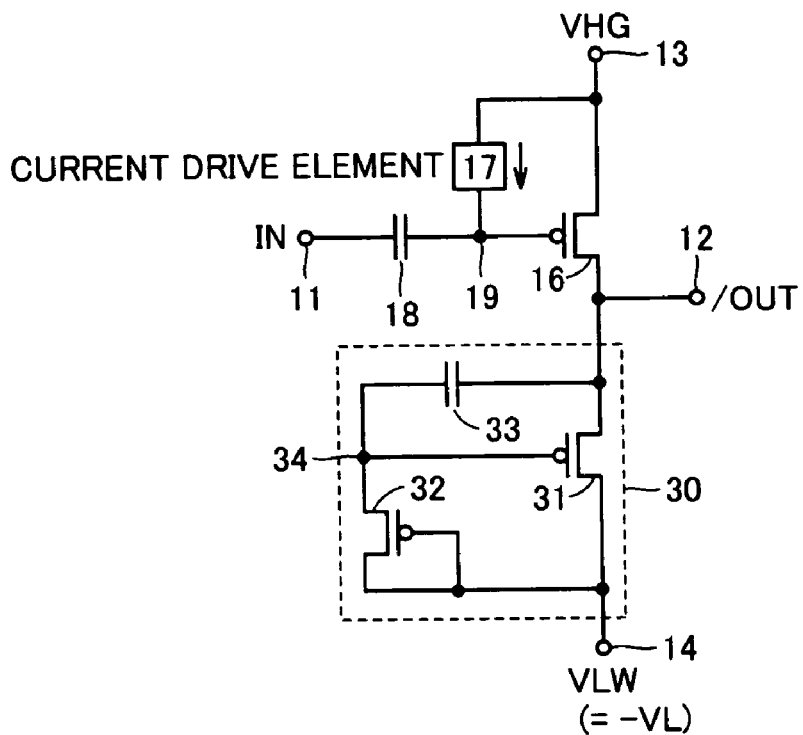
FIG. 8 shows a modification of the third embodiment of the invention.

FIG. 8 shows a configuration of a modification of the level converting circuit according to a third embodiment of the invention. The level converting circuit shown in FIG. 8 is substantially the same as the level converting circuit shown in FIG. 5, except for inclusion of a bootstrapping type load circuit 30 instead of current drive element 15. Other configuration of the level converting circuit shown in FIG. 8 is the same as in the level converting circuit shown in FIG. 5. Corresponding portions are allotted with the same reference numerals, and description thereof is not repeated.

Bootstrapping type load circuit 30 includes a P-channel MOS transistor 31 that is connected between output node 12 and low-side power supply node 14, and has a gate connected to a node 34, a P-channel MOS transistor 32 that has a gate and a drain connected to low-side power supply node 14, and has a source connected to node 34, and a capacitance element 33 connected between output node 12 and node 34.

MOS transistor 32 in the on state maintains the node 34 at the voltage level of (VLW+Vthp), where Vthp represents an absolute value of the threshold voltage of MOS transistor 32.

Figure 9:
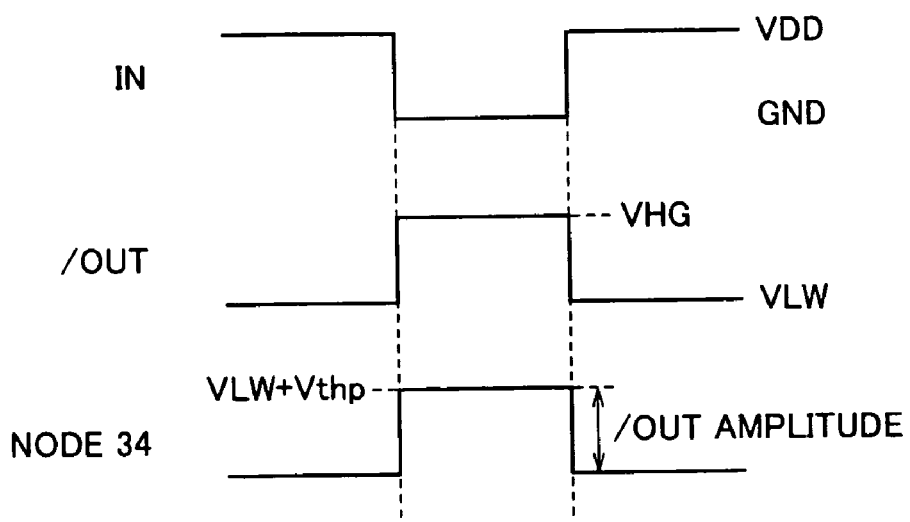
FIG. 9 is a signal waveform diagram illustrating an operation of a level converting circuit shown in FIG. 8.

FIG. 9 is a signal waveform diagram illustrating an operation of the level converting circuit shown in FIG. 8. The operation of the level converting circuit shown in FIG. 8 is similar to that represented by the signal waveforms in FIG. 6. When input signal IN falls from the high level of voltage VDD to the low level of voltage GND, the voltage level of node 19 lowers, and MOS transistor 16 is turned on so that output signal /OUT from output node 12 attains the high level. When output signal /OUT rises, MOS transistor 32 turns conductive even if the potential of node 34 rises through the capacitance coupling of capacitance element 33, and therefore the potential of node 34 is maintained at the voltage level of (VLW+Vthp). In accordance with the potential rising of output node 12, the source of MOS transistor 31 is provided by output node 12. Generally, the voltage of (VH−(Vthp+VLW)) is larger than absolute value Vthp of the threshold voltage. Therefore, MOS transistor 31 keeps the on state. Output signal /OUT attains the voltage level determined by the current driving capabilities (on-resistances) of MOS transistors 16 and 31. By making the current driving capability of MOS transistor 31 sufficiently smaller than that of MOS transistor 16, output signal /OUT can be raised to the level of voltage VH.

When input signal IN rises from reference voltage GND to voltage VDD, the voltage level of gate node 19 rises, and MOS transistor 16 turns non-conductive. At this time, MOS transistor 31 discharges output node 12 to lower its voltage level. Capacitance element 33 transmits this voltage level lowering of output node 12 to node 34. When the voltage level of node 34 lowers below the voltage of (VLW+Vthp), MOS transistor 32 turns non-conductive. Accordingly, node 34 enters the floating state, and through the capacitance coupling of capacitance element 33, the voltage level of node 34 further lowers in accordance with the potential lowering of output node 12. Thus, MOS transistor 31 enters a deep on-state. Accordingly, MOS transistor 31 discharges output node 12 with a large current driving power. When the potential of node 34 lowers to or below the voltage of (VLW−Vthp), output signal /OUT lowers to the level of low level voltage of VLW (i.e., −VL).

An amount of this voltage change of node 34 is determined by the capacitance division by capacitance element 33 and the parasitic capacitance of node 34. By sufficiently increasing the capacitance value of capacitance element 33, the voltage level of node 34 can be fully changed in accordance with output signal /OUT, and MOS transistor 31 can be switched between the deep on-state and the shallow on-state so that output signal /OUT from output node 12 can be changed.

Specifically, the level converting circuit shown in FIG. 8 has the function of converting the level of the high-level voltage, and further can increase the falling rate of output signal /OUT, as compared with the case using the current drive element shown in FIG. 5.

According to the third embodiment of the invention, as described above, the bootstrapping type load circuit is utilized as the load element for the output node, and thus the level-converted signal can be quickly outputted.

[Fourth Embodiment]

Figure 10:
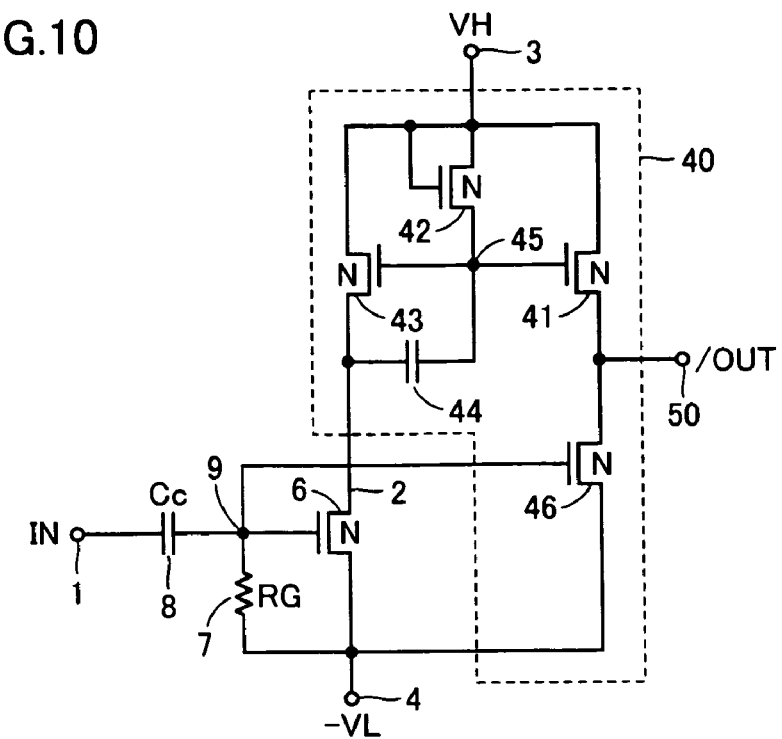
FIG. 10 shows a configuration of a level converting circuit according to a fourth embodiment of the invention.

FIG. 10 shows a configuration of a level converting circuit according to a fourth embodiment of the invention. The level converting circuit shown in FIG. 10 further includes an output assisting circuit 40 that produces output signal /OUT at a converted level to a final output node 50 in accordance with a signal produced on output node 2. A circuit portion generating a signal onto output node 2 in accordance with input signal IN applied to input node 1 has the same configuration as that in the level converting circuit shown in FIG. 1. Corresponding portions are allotted with the same reference numerals, and description thereof is not repeated.

Output assisting circuit 40 has an N-channel MOS transistor 41 that is connected between high-side power supply node 3 and final output node 50 and has a gate connected to a node 45, an N-channel MOS transistor 42 that has a gate and a drain connected to high-side power supply node 3 as well as a source connected to node 45, an N-channel MOS transistor 43 that is connected between high-side power supply node 3 and output node 2 and has a gate connected to node 45, a capacitance element 45 connected between output node 2 and node 45, and an N-channel MOS transistor 46 that is connected between final output node 50 and low-side power supply node 4 and has a gate connected to gate node 9.

In the level converting circuit shown in FIG. 10, the initial input stage receiving input signal IN and discharging output node 2, has the same configuration as that of the level converting circuit shown in FIG. 1. Corresponding portions are allotted with the same reference numerals, and description thereof is not repeated.

Figure 11:
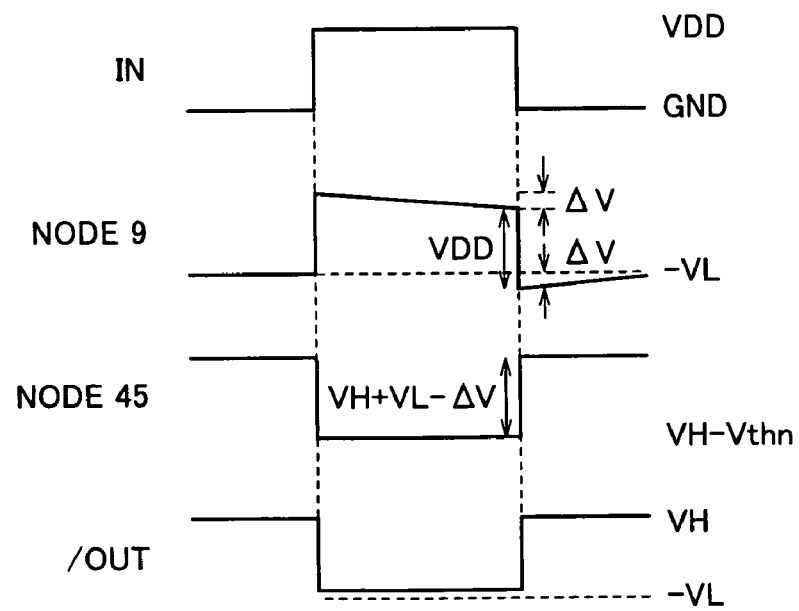
FIG. 11 is a signal waveform diagram illustrating an operation of the level converting circuit shown in FIG. 10.

FIG. 11 is a signal waveform diagram illustrating an operation of the level converting circuit shown in FIG. 10. Referring to FIG. 11, the operation of the level converting circuit shown in FIG. 10 will now be described.

Input signal IN applied to input node 1 changes between voltage VDD and reference voltage GND. In accordance with input signal IN, the voltage level of gate node 9 changes between voltage –VL and the voltage of (VDD–VL). It is now assumed that a voltage change $\Delta V$ caused by discharging through resistance element 7 is sufficiently small. In addition, it is assumed that the parasitic capacitance of gate node 9 is sufficiently smaller than the capacitance value of capacitance element 8, and is substantially negligible.

When output node 2 is at the low level of voltage –VL, MOS transistor 42 maintains the node 45 at the level of voltage of (VH–Vthn).

When input signal IN rises from reference voltage GND to voltage VDD, the voltage level of gate node 9 rises, MOS transistor 6 has a reduced on-resistance, to lower the voltage level of output node 2. In this state, MOS transistor 42 maintains node 45 at the level of voltage of (VH–Vthn). Therefore, MOS transistor 41 maintains the on state, and the voltage level of output node 2 is kept at the voltage level determined by the current driving capabilities (or on-resistances) of MOS transistors 43 and 6.

In the above operation, MOS transistor 46 is also turned on, and the voltage level of output signal /OUT from final output node 50 lowers. Since MOS transistor 41 is also conductive, the lowered voltage level of output signal /OUT is determined by the current driving capabilities (or on-resistances) of MOS transistors 41 and 46. When MOS transistor 41 is configured to have the current driving capability sufficiently smaller than that of MOS transistor 46, or is configured to have the on-resistance sufficiently higher than that of MOS transistor 46, the low-level voltage of output signal /OUT can be made substantially equal to voltage –VL.

When input signal IN falls from voltage VDD to reference voltage GND, the voltage level of gate node 9 lowers so that the gate to source voltage of MOS transistor 6 becomes equal to or lower than its threshold voltage, and MOS transistor 6 is turned off. Accordingly, output node 2 is charged by MOS transistor 43, and its voltage level rises. Capacitance element 44 transmits this potential rising of output node 2 to node 45, and MOS transistor 42 turns non-conductive, and accordingly, the voltage level of node 45 further rises from the precharged voltage level. Responsively, the on-resistance of MOS transistor 43 decreases (the current driving power increases), and the voltage level of output node 2 quickly rises and this voltage rising of output node 2 is fed back to node 45. Accordingly, MOS transistor 43 charges output node 2 up to the level of voltage VH. The voltage level of node 45 rises from the precharged voltage of (VH–Vthn) by (VH+VL–$\Delta V$). By this voltage rising of node 45, MOS transistor 41 enters the deep on-state, and quickly charges output node 50 to raise output signal /OUT to the level of voltage VH. In this state, the gate to source voltage of MOS transistor 46 is equal to or lower than the threshold voltage, and MOS transistor 46 is in the non-conductive state, similarly to MOS transistor 6.

The conductive state and the non-conductive state described above represent the state of driving the current and the state of cutting off the current, respectively.

Even the level converting circuit shown in FIG. 10 can convert the signal changing between voltage VDD and reference voltage GND to the signal changing between voltage VH and voltage –VL (+$\Delta V$). In particular, output node 50 is charged using MOS transistor 41. Therefore, even if a capacitive load is connected to output node 50, the voltage level of node 45 can be quickly raised to the voltage of (VH+VL–$\Delta V$) without an influence by such capacitive load. When output signal /OUT falls, the potential of node 45 can be recovered from the high voltage level to the level of precharged voltage of (VH–Vthn) without an influence by the capacitive load. Thus, output signal /OUT can quickly fall from the high level to the low level.

[Modification]

Figure 12:
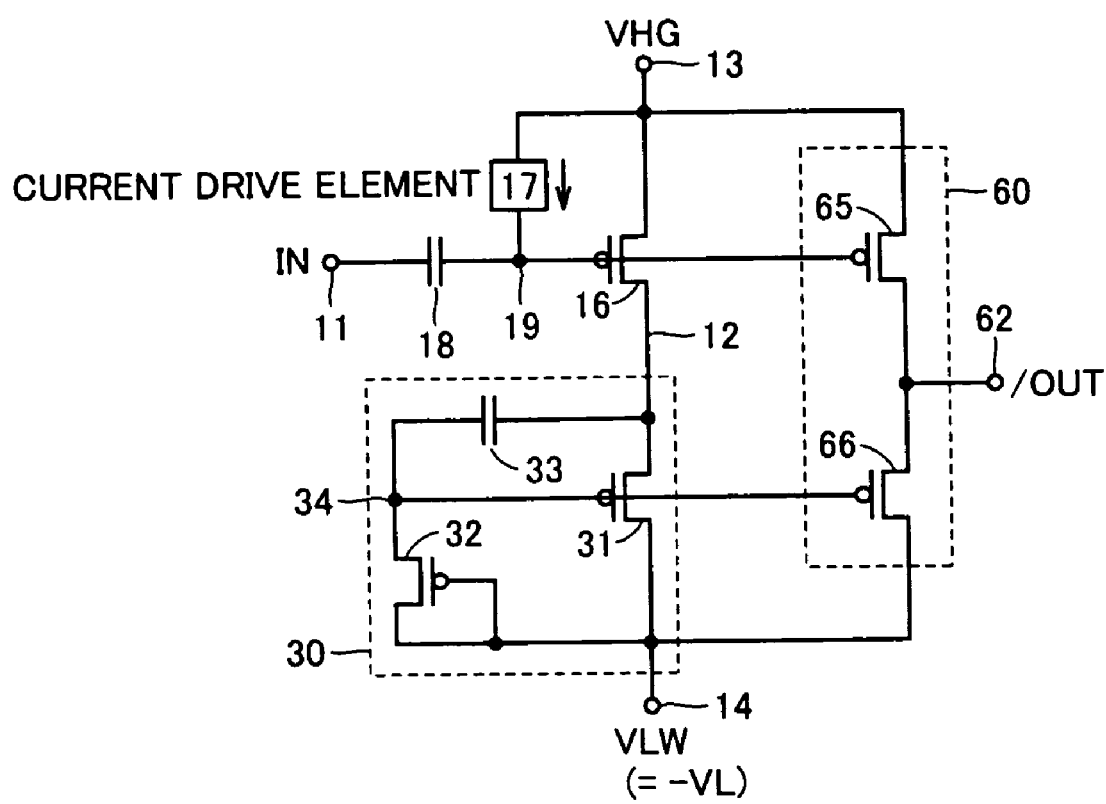
FIG. 12 shows a modification of the fourth embodiment of the invention.

FIG. 12 shows a modification of the level converting circuit according to the fourth embodiment of the invention. The level converting circuit shown in FIG. 12 includes, additionally in the level converting circuit shown in FIG. 8, a push-pull stage 60 for driving a final output node 62 in accordance with the voltages on gate node 19 and node 34. Other configuration of the level converting circuit shown in FIG. 12 is the same as in the level converting circuit shown in FIG. 8. Corresponding portions are allotted with the same reference numerals, and description thereof is not repeated.

Push-pull stage 60 includes a P-channel MOS transistor 65 that is connected between high-side power supply node 13 and final output node 62 and has a gate connected to node 19, and a P-channel MOS transistor 66 that is connected between final output node 62 and low-side power supply node 14 and has a gate connected to node 34.

In the configuration of the level converting circuit shown in FIG. 12, capacitance element 33 of the bootstrapping type load circuit is isolated from final output node 62. Therefore, the bootstrapping effect of capacitance element 33 can be fully increased without an influence by the capacitive load at final output node 62, and output signal /OUT can be quickly produced. Operation waveforms of the level converting circuit illustrated in FIG. 12 are similar to those illustrated in FIG. 9. It is possible to raise quickly output signal /OUT from voltage VHG to voltage VLW (=−VL), where a factor such as a parasitic capacitance is neglected.

According to the fourth embodiment of the invention, as described above, the bootstrapping type load circuit is isolated from the final output node, and the push-pull stage drives the final output node. Thus, the output signal can be changed quickly.

[Fifth Embodiment]

Figure 13:
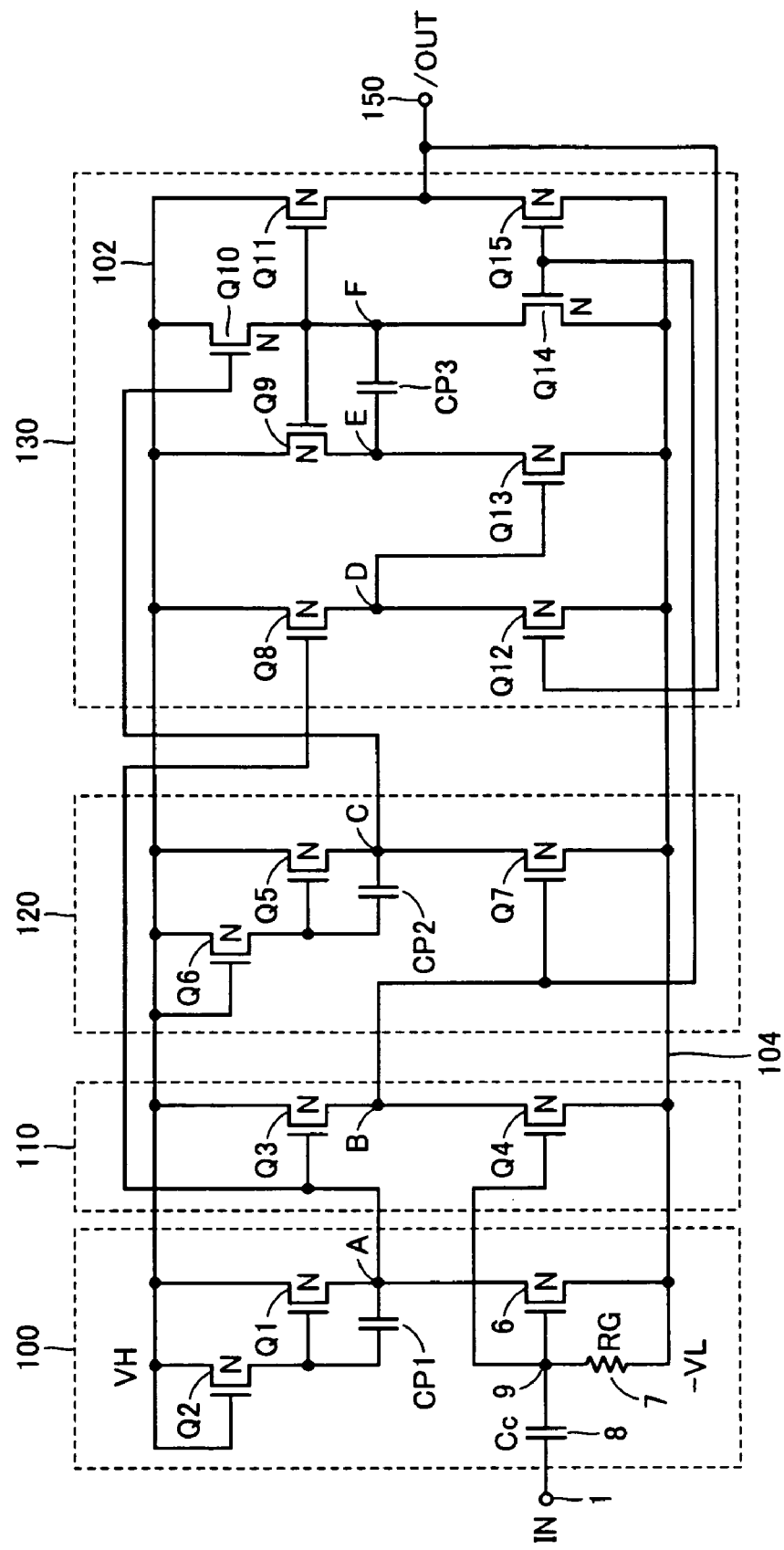
FIG. 13 shows a configuration of a level converting circuit according to a fifth embodiment of the invention.

FIG. 13 shows a structure of a level converting circuit according to a fifth embodiment of the invention. In FIG. 13, the level converting circuit includes an input stage 100 that converts input signal IN applied to input node 1 to a signal changing between voltages VH and −VL onto a node A, a push-pull stage 110 for driving a node B in accordance with complementary signals applied from input stage 100, a bootstrapping type drive stage 120 for driving a node C in accordance with an output signal of push-pull stage 110, and a final drive stage 130 for driving an output node 150 in accordance with the output signals of input stage 100, push-pull stage 110 and bootstrapping type drive stage 120 as well as final output signal OUT.

Input stage 100 has a configuration similar to that of the level converting circuit shown in FIG. 7, and includes capacitance element 8 transmitting input signal IN to gate node 9, resistance element 7 connected between gate node 9 and a low-side power supply line 104, N-channel MOS transistor 6 selectively made conductive in accordance with the voltage level of gate node 9, to drive node A to the voltage level corresponding to the level of voltage −VL on low-side power supply line 104, an N-channel MOS transistor Q1 connected between a high-side power supply line 102 and node A, an N-channel MOS transistor Q2 for transmitting a voltage of (VH−Vthn) to the gate of MOS transistor Q1 when made conductive, and a capacitance element CP1 connected between a gate of MOS transistor Q1 and node A.

Input stage 100 operates similarly to the level converting circuit shown in FIG. 7, and converts input signal IN changing between voltages VDD and GND to a signal changing between voltage VH and voltage −VL onto node A.

In the following description, the influences which may be exerted on the voltage levels of the output signal and input signal due to the parasitic capacitance of an internal node, discharging through the resistance element 7 and the current driving powers (or on-resistances) of the MOS transistors are neglected, and each circuit is assumed to operate as a ratio circuit, to change the output signal of each stage between voltages of VH and −VL. In addition, MOS transistors 6 and Q1–Q15 are each assumed to have a threshold voltage Vthn.

Push-pull stage 110 includes N-channel MOS transistor Q3 for supplying a current from high-side power supply line 102 to node B in accordance with the signal on node A, and N-channel MOS transistor Q4 for supplying a current from node B to low-side power supply line 104 in accordance with the signal on gate node 9.

In push-pull stage 110, when input signal IN rises from the low level to the high level, MOS transistor Q4 turns conductive to lower the voltage level of node B. In this operation, the voltage level of output node A of input stage 100 lowers, and the voltage difference between nodes A and B changes to or below Vthn. Responsively, MOS transistor Q3 turns non-conductive, and the voltage at node B lowers to the level of low-side power supply voltage −VL. When the voltage level of input signal IN lowers, the voltage level of gate node 9 lowers to turn MOS transistor Q4 off. MOS transistor Q1 raises the level of node A to voltage VH, and responsively MOS transistor Q3 charges node B to the level of (VH−Vthn).

In push-pull stage 110, the gate potential of MOS transistor Q3 changes after the gate potential of MOS transistor Q4 changes. Therefore, in the operation of charging the node B, MOS transistor Q3 turns conductive after MOS transistor Q4 turns non-conductive, and therefore, a through current hardly occurs. In the operation of discharging the node B, MOS transistor Q3 turns non-conductive after MOS transistor Q4 turns conductive. With the offset voltage taken into account, the gate potential of MOS transistor Q3 is equal to (−VL+ΔV). Therefore, when this voltage ΔV (i.e., the output offset voltage in input stage 100) is sufficiently smaller than the threshold voltage Vthn of MOS transistor Q3, MOS transistor Q3 can be reliably set to the turn-off state. In this push-pull stage 110, therefore, the through current flows only in the operation of discharging the node B, and thus the current (DC current) is consumed only for a short switching time period.

Bootstrapping type drive stage 120 includes N-channel MOS transistor Q7 for driving the node C to the level of low-side power supply voltage −VL in accordance with the signal on output node B in push-pull stage 110, N-channel MOS transistor Q5 connected between high-side power supply line 102 and node C, a capacitance element CP2 connected between the gate of MOS transistor Q5 and node C, and N-channel MOS transistor Q6 for charging the gate of MOS transistor Q5 to the voltage of (VH−Vthn) when made conductive.

Bootstrapping type drive stage 120 operates substantially in the same manner as input stage 100. When the voltage level of output node B of push-pull stage 110 rises, MOS transistor Q7 is turned on, and node C is driven to the level of low-side power supply voltage −VL (the level determined by the on-resistances or current driving capabilities of MOS transistors Q5 and Q7). When the voltage level of output node B of push-pull stage 110 lowers, MOS transistor Q7 turns non-conductive. In this state, MOS transistor Q5 charges node C and has the gate potential thereof boosted through the bootstrapping operation by capacitance element CP2, and node C is driven to the level of voltage VH. Therefore, node C changes between voltages VH and −VL.

Output drive stage 130 of the ratio-less bootstrap type includes N-channel MOS transistor Q8 that charges a node D with a current supplied from high-side power supply line 102 in accordance with the signal on output node A of input stage 100, N-channel MOS transistor Q12 that discharges a current from node D to low-side power supply line 104 in accordance with output signal OUT on final output node 150, N-channel MOS transistor Q13 that turns conductive to discharge a node G to the voltage level of low-side power supply line 104 when the voltage level of node D is at the high level, a capacitance element CP3 connected between nodes E and F, N-channel MOS transistor Q14 discharging node F in accordance with the signal on output node B of push-pull stage 110, N-channel MOS transistor Q10 that charges the node F from high-side power supply line 102 in accordance with the signal from output node C of bootstrapping type drive stage 120, N-channel MOS transistor Q9 that is connected between high-side power supply line 102 and node E and has a gate connected to node F, N-channel MOS transistor Q11 supplying a current from high-side power supply line 102 to output node 150 in accordance with the signal voltage on node F, and N-channel MOS transistor Q15 that is selectively made conductive in accordance with the signal outputted from output node B of push-pull stage 110, to drive final output node 150 to the level of voltage −VL.

In final output drive stage 130 of the ratio-less bootstrap type, of which detailed operations will be described below, a path of the current from high-side power supply line 102 to low-side power supply line 104 is cut off by utilizing delay in change of the signals, and accordingly the current consumption is reduced. Further, final output drive stage 130 of the ratio-less bootstrap type accurately produces output signal OUT changing between voltages VH and −VL.

Figure 14:
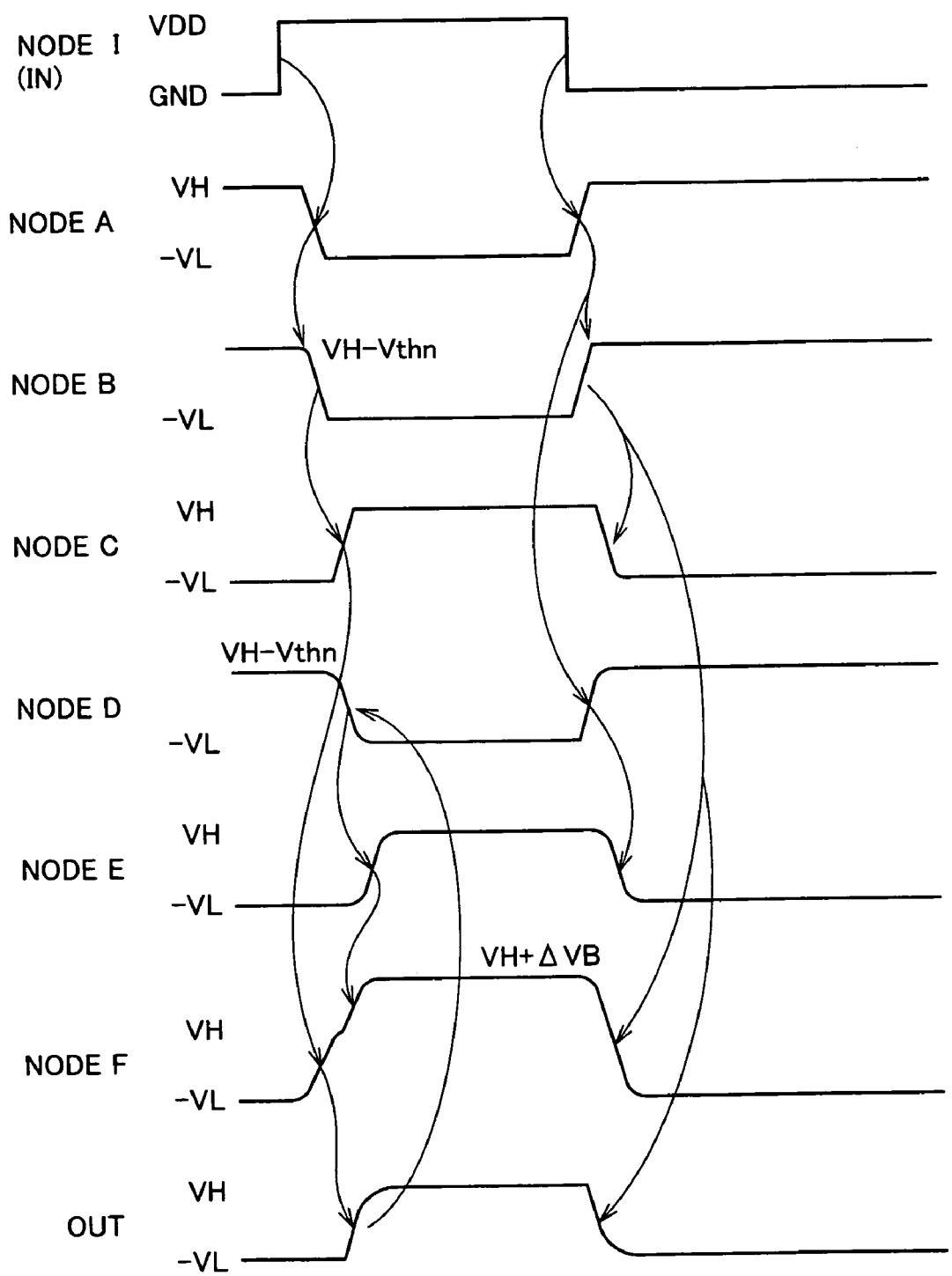
FIG. 14 is a signal waveform diagram illustrating an operation of the level converting circuit shown in FIG. 13.

FIG. 14 is a signal waveform diagram illustrating an operation of the level converting circuit shown in FIG. 13. The operation of the level converting circuit shown in FIG. 13 will now be described with reference to FIG. 14.

When input signal IN applied to input node 1 rises from reference voltage GND to high-level voltage of VDD, MOS transistor 6 in input stage 100 turns conductive to lower the level of node A from high-side power supply voltage VH to a voltage close to low-side power supply voltage −VL. It is assumed that MOS transistors Q1 and 6 have the current driving capabilities or on-resistances adjusted such that the output offset voltage of input stage 100 can be substantially neglected.

In push-pull stage 110, MOS transistor Q4 turns conductive to discharge node B in accordance with the rising of voltage level of gate node 9 in input stage 100, and lowers the voltage level of node B. Then, when the voltage level of output node A in input stage 100 lowers to the level of low-side power supply voltage −VL, the gate-source voltage of MOS transistor Q3 lowers to or below the threshold voltage, and accordingly, MOS transistor Q3 is turned off. Therefore, MOS transistor Q4 discharges node B to the level of low-side power supply voltage −VL.

In bootstrapping type drive stage 120, MOS transistor Q7 transits towards the non-conductive state in accordance with the lowering of the voltage level of node B, and node C is charged by MOS transistor Q5, and through the bootstrap operation of capacitance element CP2, node C is charged to the level of high-side power supply voltage VH. In this state, node B is discharged to the level of low-side power supply voltage −VL so that MOS transistor Q7 is kept in the non-conductive state.

Output drive stage 130 of the ratio-less bootstrap type operates as follows. First, output signal OUT is at the low level of low-side power supply voltage −VL, and MOS transistor Q12 is in the non-conductive state. Output node A of input stage 100 is at the voltage level of low-side power supply voltage −VL, and MOS transistor Q8 is also in the non-conductive state. In the previous cycle, node D attained the level of voltage (VH−Vthn) in accordance with input signal IN at the low level. In accordance with the signal on output node B of push-pull stage 110, MOS transistors Q14 and Q15 are first set to the non-conductive state.

Then, when the voltage level of output node C of bootstrap-type drive stage 120 rises, MOS transistor Q10 is turned on to charge the node F. In the operation of charging the node F by MOS transistor Q10, MOS transistor Q14 is already in the off state in accordance with the potential on node B, and therefore a current is prevented from flowing from high-side power supply line 102 to low-side power supply line 104 through MOS transistors Q10 and Q14.

When the voltage level of node F rises, MOS transistor Q11 turns conductive to charge output node 150 to raise the voltage level of output signal OUT. In this operation of charging output node 150, MOS transistor Q11 turns conductive after MOS transistor Q15 turns non-conductive in accordance with the signal on output node B in push-pull stage 110. Therefore, no current path from high-side power supply line 102 to low-side power supply line 104 exists. When node D is maintained at the level of voltage of (VH−Vthn), node E is at the level of low-side power supply voltage −VL, and node F is charged to have its voltage level raised from low-side power supply voltage −VL to the voltage of (VH−Vthn).

When the voltage level of output signal OUT rises and the gate-source voltage of MOS transistor Q12 exceeds its threshold voltage, MOS transistor Q12 discharges node D to lower its voltage level, and MOS transistor Q13 turns non-conductive.

When MOS transistor Q13 turns non-conductive, MOS transistor Q9 raises the voltage level of node E in accordance with the voltage level of node F. When the voltage of node F rises while node E is at the raised voltage level, MOS transistor Q10 turns non-conductive. Accordingly, node F enters the floating state, and through capacitance coupling of capacitance element CP3, the voltage level of node F is raised to the voltage of (VH+ΔVB) in accordance with the rising of the voltage level of node E. Therefore, MOS transistor Q9 charges node E to the level of voltage VH. In accordance with the boosting of voltage level of node F, the gate potential of MOS transistor Q11 further rises and output signal OUT from output node 150 is quickly driven to the level of voltage VH.

Therefore, a current flows through a path of MOS transistors Q9 and Q13 in the operation of raising the voltage level of output signal OUT. However, the current consumption can be reduced by sufficiently reducing the current driving capabilities of these MOS transistors Q9 and Q13. Further, DC current (flowing from high-side power supply line 102 to low-side power supply line 104) flows through MOS transistors Q9 and Q13 only for a time period corresponding to a transition time of the output signal, and thus this time period can be made sufficiently short. By adequately enhancing the current driving capability of MOS transistor Q11, output signal OUT can be quickly driven to the level of voltage VH even when the load of output node 150 is large.

When input signal IN falls from high-level voltage VDD to the low-level voltage (reference voltage GND), the voltage level of node 9 in input stage 100 first attains the voltage level close to voltage −VL. The voltage level of node A rises, and the voltage level of node A attains high-side power supply voltage VH.

In accordance with the rising of voltage level of node A, MOS transistor Q3 in push-pull stage 110 turns conductive to drive node B to the voltage level of (VH−Vthn). In this operation, MOS transistor Q4 already turns non-conductive in accordance with the voltage level of node 9. In the operation of charging node B, therefore, a current path from high-side power supply line 102 to low-side power supply line 104 does not exist.

When the voltage level of output node B in push-pull stage 110 rises, MOS transistor Q7 in bootstrapping type drive stage 120 discharges the node C to lower its voltage level.

In final output stage 130, MOS transistors Q14 and Q15 turn conductive in accordance with the rising of voltage level of output node B in push-pull stage 110, and lower the voltage level at node F to the level of voltage −VL, and also lowers the voltage level of output signal OUT. Responsively, MOS transistors Q9 and Q11 turn conductive, and MOS transistor Q15 drives the output signal OUT generated from output node 150 to the level of low-side power supply voltage −VL.

In accordance with the rising of voltage level of output node A in input stage 100, MOS transistor Q8 turns conductive to charge the node D to the voltage level of (VH−Vth), and responsively MOS transistor Q13 turns conductive to drive the node E to the level of voltage −VL. When MOS transistor Q13 is conductive, MOS transistor Q9 already turns conductive in response to the potential lowering of node F responsive to the potential change of node B. When the voltage level of node E lowers, therefore, a path of current flowing through MOS transistors Q9 and Q13 does not exist.

When the voltage level of output signal OUT falls, MOS transistor Q12 turns non-conductive. Before MOS transistor Q12 turns non-conductive in response to fall of voltage level of output signal OUT, a current flows from high-side power supply line 102 to low-side power supply line 104 through MOS transistors Q8 and Q12. However, output signal OUT is rapidly driven to low-side power supply voltage −VL, and therefore, an amount of the current flowing through MOS transistors Q8 and Q12 can be made sufficiently small.

In the steady state, a path for flowing a DC current from high-side power supply line 102 to low-side power supply line 104 does not exist in final output stage 130. Therefore, MOS transistors Q11 and Q15 can have increased driving capabilities, and thus can quickly drive the final output node to change output signal OUT even when output node 150 is accompanied by a large output load capacitance.

Input stage 100 and bootstrapping type rive stage 120 are ratio circuits, and current flows through MOS transistors Q1 and Q6 as well as through MOS transistors Q5 and Q7. However, in input stage 100 and bootstrapping type drive stage 120, the voltage levels of nodes A and C change complementarily to each other. Therefore, a current flows only when one of input stage 100 and bootstrapping type drive stage 120 outputs a low-level signal in accordance with the logical level of input signal IN, and the power consumption thereof can be made substantially equal to that of the level converting circuit including only one bootstrapping type load circuit.

In the structure of the level converting circuit shown in FIG. 13, with the N-channel MOS transistors replaced with P-channel MOS transistors, and with the voltage polarities inverted by supplying the voltages −VL and VH to power supply lines 102 and 104, respectively, a similar level converting circuit can be achieved.

According to the fifth embodiment of the invention, as described above, a ratio-less circuit is used to drive the final output node in accordance with the output signal of the level converting stage in the initial position. Thus, it is possible to implement the level converting circuit, which can quickly change the output signal with low current consumption.

[Sixth Embodiment]

Figure 15:
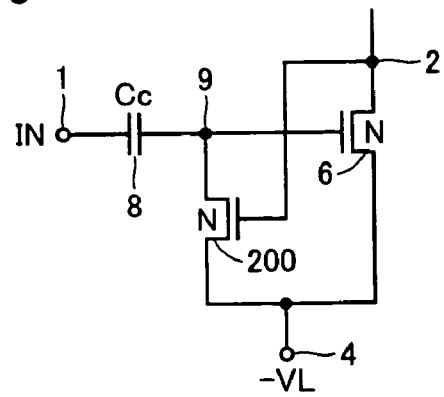
FIG. 15 shows a configuration of a main portion of a level converting circuit according to a sixth embodiment of the invention.

FIG. 15 shows a configuration of a main portion of a level converting circuit according to a sixth embodiment of the invention. FIG. 15 shows a configuration of a conversion stage at an input initial stage, for driving the output node 2 in accordance with input signal IN. The conversion stage at input initial stage shown in FIG. 15 may be combined with any one of the first to fifth embodiments. The conversion stage at input initial stage shown in FIG. 15 includes an N-channel MOS transistor 200 that is provided between node 9 and low-side power supply node 4 and is selectively made conductive in accordance with the signal on output node 2. Thus, MOS transistor 200 is used, e.g., in place of resistance element 7 of the level converting circuit shown in FIG. 1.

Figure 16:
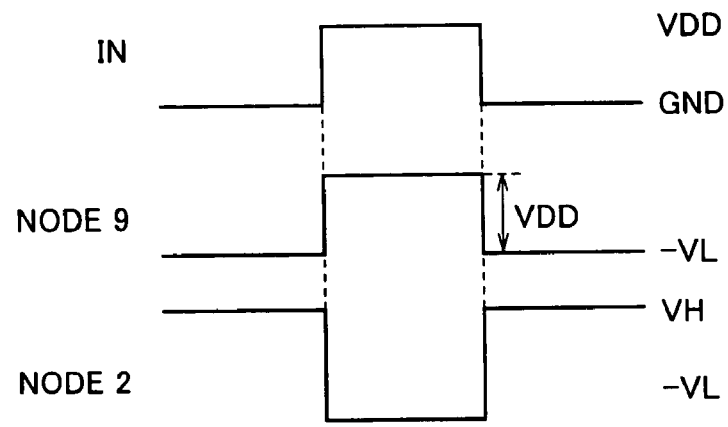
FIG. 16 is a signal waveform diagram illustrating an operation of the circuit shown in FIG. 15.

FIG. 16 is a signal waveform diagram illustrating an operation of the level converting circuit shown in FIG. 15. Referring to FIG. 16, the operation of the conversion stage at the input initial stage shown in FIG. 15 will now be described. When input signal IN is at the level of reference voltage GND, output node 2 is at the level of voltage VH, and MOS transistor 200 maintains node 9 at the level of low-side power supply voltage −VL.

When input signal IN rises from the low-level (GND) to the high level (VDD), the voltage level of node 9 rises so that MOS transistor 6 turns conductive to lower the voltage level of node 2. The voltage level of output node 2 is higher than low-side power supply voltage −VL because a circuit portion for driving the output node 2 of the level converting stage is a ratio circuit. By sufficiently reducing the output offset voltage, MOS transistor 200 can be set to the non-conductive state. In this case, a leakage current merely flows in MOS transistor 200, and the lowering of the voltage level of node 9 does not occur in contrast to the case of utilizing a resistance element. Thus, there is no restriction on the high-level time period of input signal IN, which improves flexibility of the circuitry.

Further, the gate potential of MOS transistor 6 can be kept constant, and accordingly, output node 2 is kept at a constant voltage level. Therefore, a problem of rising of the low-level voltage on output node 2 can be eliminated, and it is possible to improve an operating margin for the low-side voltage of the circuit receiving the voltage on output node 2.

[Modification]

Figure 17:
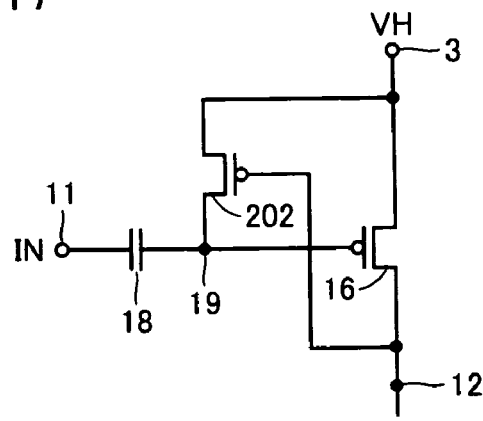
FIG. 17 shows a modification of the sixth embodiment of the invention.

FIG. 17 shows a modification of the sixth embodiment of the invention. In FIG. 17, P-channel MOS transistor 16 is used to convert the level of the high-level voltage of input signal IN. In this conversion stage at input initial stage, a P-channel MOS transistor 202, which is selectively rendered conductive in response to the voltage on output node 12, is connected between high-side power supply node 3 and gate node 19 of MOS transistor 16. In other words, the input conversion stage shown in FIG. 17 utilizes P-channel MOS transistor 202 responsive to the signal on output node 12 in place of current driving element 17 of the level converting circuit shown in FIG. 5.

In the configuration of the input conversion stage shown in FIG. 17, when input signal IN attains the low level and accordingly, capacitance element 18 lowers the voltage level of node 19, node 12 is charged by MOS transistor 16 to attain the voltage level close to high-side power supply voltage VH. In this case, therefore, if the offset voltage of output node 12 is set to the voltage level maintaining MOS transistor 202 in the non-conductive state, MOS transistor 202 can be kept non-conductive. Accordingly, such a situation can be prevented that a charging current raises the voltage level of node 19 when input signal IN is at the low level, and thus the restriction on the low-level time period of input signal IN can be eliminated.

When input signal IN rises to the high level, node 19 is driven to the level of high-side power supply voltage VH by capacitance element 18, and MOS transistor 16 turns non-conductive so that no adverse influence is exerted on the low-level voltage of output node 12. In this state, MOS transistor 202 maintains node 19 at the level of high-side power supply voltage VH.

According to the sixth embodiment of the invention, as described above, the gate node of the output drive MOS transistor, which receives on its gate the input signal through the capacitance element, is connected to the MOS transistor receiving on its gate the voltage on the drive node of the output drive MOS transistor. Thus, it is possible to suppress the change in potential of the gate node of the output drive MOS transistor, and restrictions on the high- and low-level time periods of the input signal can be eliminated.

[Seventh Embodiment]

Figure 18:
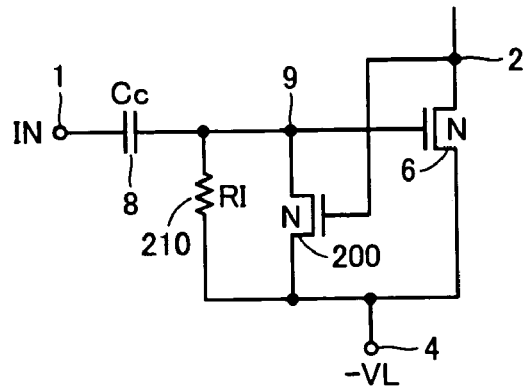
FIG. 18 shows a configuration of a main portion of a level converting circuit according to a seventh embodiment of the invention.

FIG. 18 shows a configuration of a main portion of the level converting circuit according to the seventh embodiment of the invention. The level converting circuit shown in FIG. 18 has further a resistance element 210 of a high resistance connected between gate node 9 and low-side power supply node 4 in the configuration of the level converting circuit shown in FIG. 15. Other configuration of the circuit shown in FIG. 18 is the same as the level converting circuit shown in FIG. 15. Corresponding portions are allotted with the same reference numerals, and description thereof is not repeated.

Resistance element 210 has a sufficiently large resistance value RI. By utilizing resistance element 210, the initial potential of gate node 9 is set to low-side power supply voltage −VL. Resistance element 210 has sufficiently large resistance value RI to have a driving current smaller than the leakage current of MOS transistor 200. Accordingly, unnecessary change in potential level of gate node 9 in the steady state can be reliably suppressed, and the signal can be produced on output node 2 in accordance with input signal IN with the potential of gate node 9 accurately initialized.

Although not shown in the figure, the circuitry shown in FIG. 17 can likewise be configured in accordance with the seventh embodiment of the invention such that a resistance element of a high resistance is connected in parallel with MOS transistor 202. In such arrangement, the voltage level of gate node 19 can be initialized to high-side power supply voltage VH.

According to the seventh embodiment of the invention, as described above, the output drive MOS transistor, which receives on its gate the input signal through the capacitance element, is configured to have the gate connected to the resistance element (current limiting element) that has a high resistance and is connected in parallel with the MOS transistor receiving the output node potential on its gate. Thus, the gate potential of the output drive MOS transistor can be initialized to a predetermined voltage level.

[Eighth Embodiment]

Figure 19:
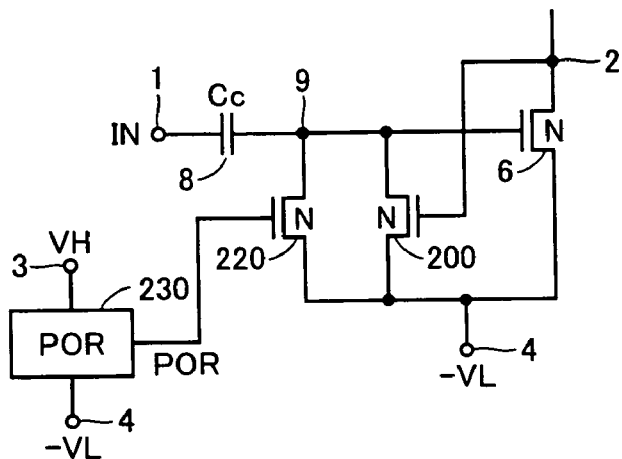
FIG. 19 shows a configuration of a main portion of a level converting circuit according to an eighth embodiment of the invention.

FIG. 19 shows a configuration of a main portion of the level converting circuit according to an eighth embodiment of the invention. The level converting circuit shown in FIG. 19 includes, instead of resistance element 210 of a high resistance shown in FIG. 18, an N-channel MOS transistor 220, which is rendered conductive in accordance with an output signal (power-on reset signal) POR of a Power-On Reset (POR) circuit 230 and has a gate node 9 coupled to low-side power supply node 4. Other configuration of the level converting circuit shown in FIG. 19 is the same as in the level converting circuit shown in FIG. 18. Corresponding portions are allotted with the same reference numerals, and description thereof is not repeated.

Power-on reset circuit 230 operates with operation power supply voltages of high- and low-side power supply voltages VH and −VL. When these voltages VH and −VL are supplied, power-on reset circuit 230 drives power-on reset signal POR to the H-level of voltage VH, and maintains the H-level for a predetermined period. In the steady state, power-on reset signal POR is maintained at the level of low-side power supply voltage −VL.

Figure 20:
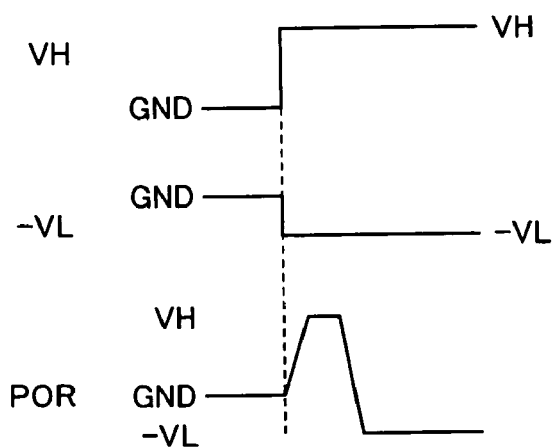
FIG. 20 is a signal waveform diagram illustrating an operation of a power-on reset circuit shown in FIG. 19.

As shown in FIG. 20, both voltages VH and −VL are at the level of reference voltage GND before power up. When the power is turned on, high-side power supply voltage VH rises to the predetermined voltage level (VH), and low-side power supply voltage −VL attains the predetermined voltage level (−VL). When the voltages VH and −VL attain the predetermined voltage levels or become stable in response to the power on, power-on reset signal POR applied from power-on reset circuit 230 rises to the level of voltage VH. Responsively, MOS transistor 220 turns conductive to connect the gate node 9 to low-side power supply node 4, and the gate node 9 is initialized to the level of voltage −VL.

When a predetermined time period elapses, power-on reset signal POR applied from power-on reset circuit 230 attains the level of voltage −VL, and MOS transistor 220 is turned off. In the normal operation, MOS transistor 220 is kept non-conductive, and accordingly exerts no adverse influence on the level converting operation on input signal IN.

Figure 21:
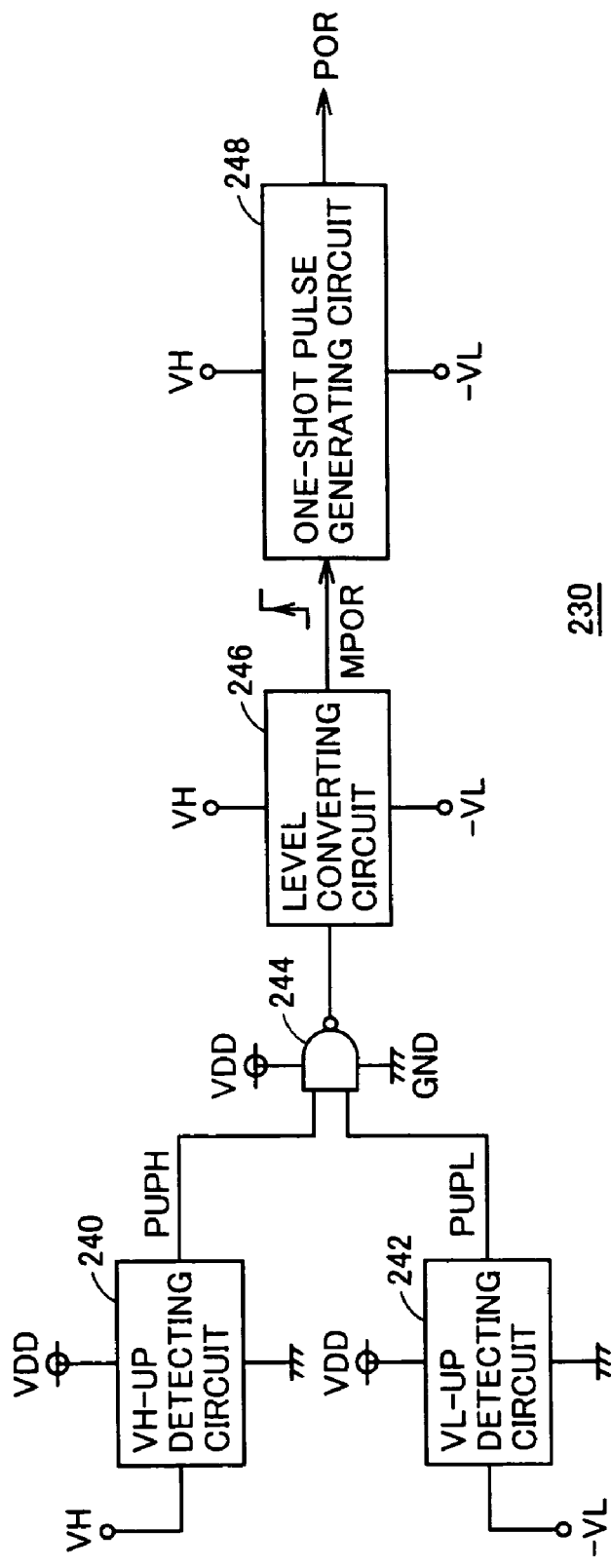
FIG. 21 schematically shows an example of a configuration of the power-on reset circuit shown in FIG. 19.

FIG. 21 schematically shows an example of the configuration of power-on reset circuit 230 shown in FIG. 19. In FIG. 21, power-on reset circuit 230 includes a VH-up detecting circuit 240 that receives the voltages VDD and GND as operation voltages and detects the power up of high-side power supply voltage VH, a VL-up detecting circuit 242 that receives the voltages VDD and GND as operation voltages and detects the power up of low-side power supply voltage VL, an NAND circuit 244 that receives voltages VDD and GND as operation power supply voltages and receives power-up detection signals PUPH and PUPL from the up detecting circuits 240 and 242, respectively, a level converting circuit 246 for converting the level of the output signal of NAND circuit 244, and a one-shot pulse generating circuit 248 for generating a pulse signal of one shot in response to the rising of an output signal MPOR of level converting circuit 246.

VH-up detecting circuit 240 includes a capacitance element and a resistance element connected in series between the high-side power supply node and the ground node, for example. In accordance with the voltage change through the capacitance coupling of this capacitance element, VH-up detecting circuit 240 determines, e.g., with an inverter, whether high-side power supply voltage VH is made on, and drives power-up detection signal PUPH to the H-level upon power up.

VL-up detecting circuit 242 includes, for example, a resistance element and a capacitance element connected in series between the power supply node receiving voltage VDD and the low-side power supply node receiving low-side power supply voltage −VL, and detects the power-up of low-side power supply voltage through the capacitance coupling of the capacitance element. When voltage −VL is powered up, VL-up detecting circuit 242 drives the output signal PUPL to the H-level.

When voltage-up detection signals PUPH and PUPL are both at the H-level of voltage VDD, NAND gate 244 drives its output signal to the level of voltage GND. When at least one of the up detection signals PUPH and PUPL is at the low level, NAND circuit 244 generates a signal at the level of voltage VDD.

Level converting circuit 246 has the configuration shown in FIG. 1, for example, and converts the output signal of NAND circuit 244 to a signal changing between the voltages VH and −VL.

One-shot pulse generating circuit 248 operates with voltages VH and −VL being the operation power supply voltages. One-shot pulse generating circuit 248 produces a pulse signal of one shot in response to the rising of the signal MPOR received from level converting circuit 246, to produce power-on reset signal POR.

Figure 22:
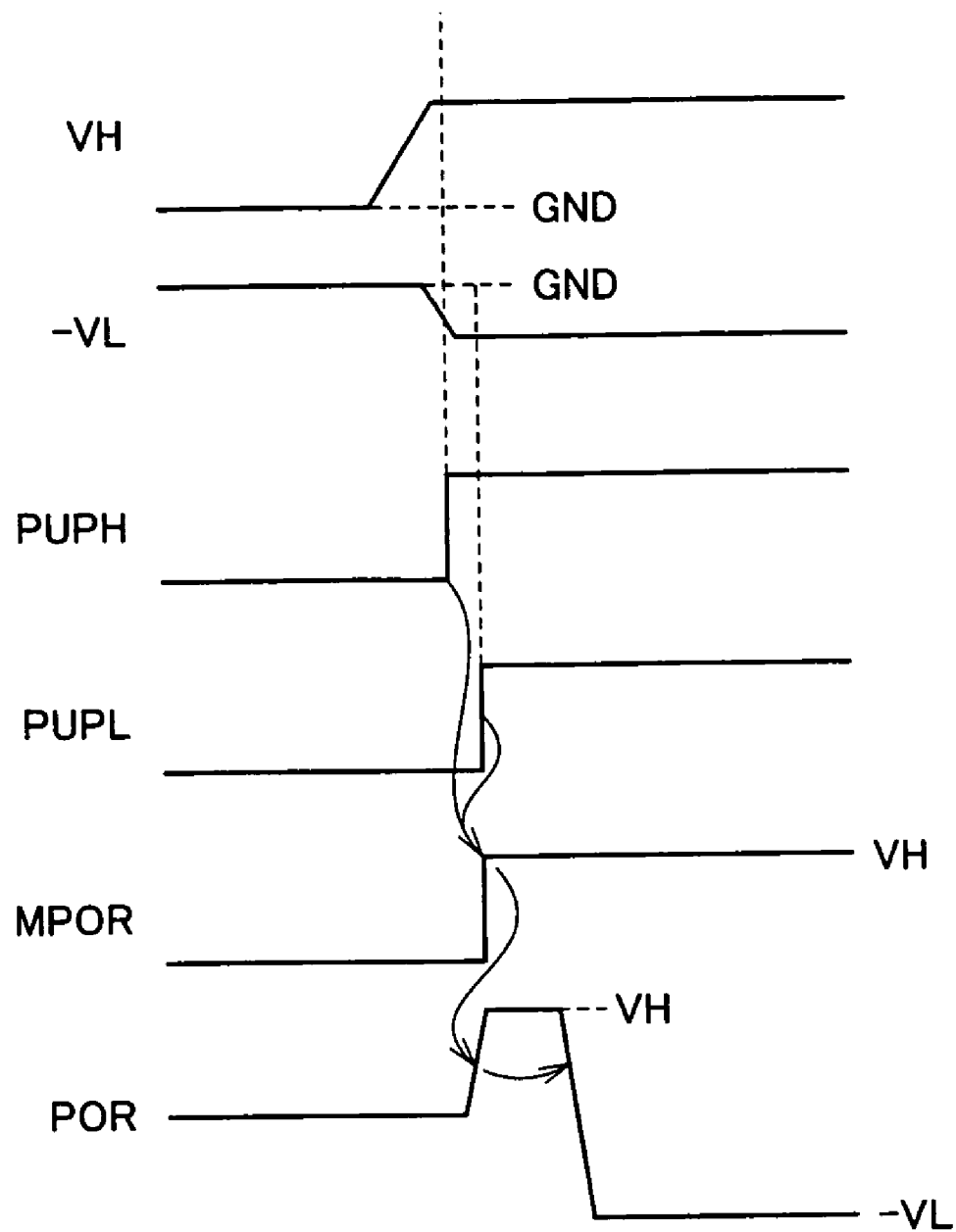
FIG. 22 is a signal waveform diagram illustrating an operation of the power-on reset circuit shown in FIG. 21.

FIG. 22 is a signal waveform diagram illustrating an operation of power-on reset circuit 230 shown in FIG. 21. Referring to FIG. 22, the operation of power-on reset circuit 23 shown in FIG. 21 will now be described.

In this power-on reset circuit 230, it is assumed that the voltages VDD and GND are stabilized faster than the voltages VH and −VL.

When voltage VH is powered up and the voltage level thereof rises, VH-up detecting circuit 240 detects this voltage rising through the capacitance coupling of the internal capacitance element, and responsively raises power-up detection signal PUPH to the high level. Likewise, when voltage −VL is powered up and the voltage level thereof lowers, VL-up detecting circuit 242 detects this lowering of the voltage level through the capacitance coupling of the internal capacitance element, and drives power-up detection signal PUPL to the high level. When both the detection signals PUPH and PUPL attain the high level of voltage VDD, the output signal of NAND circuit 244 attains the low level of voltage GND.

Level converting circuit 246 has the same configuration as that shown in FIG. 1, for example, and inverts the logical levels of the output signal of NAND circuit 244 with the signal amplitude converted. Therefore, the signal MPOR outputted from level converting circuit 246 rises to the level of voltage VH in response to the falling of the output signal of NAND circuit 244. In response to the rising of the signal MPOR, one-shot pulse generating circuit 248 drives the output signal POR to the level of voltage VH, and maintains it for a predetermined time period. When the predetermined time period elapses, one-shot pulse generating circuit 248 drives the signal POR to the level of voltage −VL.

According to the configuration of power-on reset circuit 230 shown in FIG. 21, therefore, power-on reset signal POR can be produced in the form of the one-shot pulse after both the voltages VH and −VL reach the predetermined voltage levels.

In addition, according to the configuration of power-on reset circuit 230 shown in FIG. 21, power-on reset signal POR can be produced regardless of the power-up sequence of the voltages VH and −VL after detecting circuits 240 and 242 detects the power-up of these voltages VH and −VL.

In the arrangement according to the eighth embodiment of the invention, all the N-channel MOS transistors in the configuration shown in FIG. 19 can be replaced with the P-channel MOS transistors with power supply node 4 supplied with high-side power supply voltage VH, so that the amplitude of the high-side signal can be converted. In this case, the power-on reset signal, which is an inverted signal of the output signal POR of one-shot pulse generating circuit 248 shown in FIG. 21, is applied to the gate of the initializing P-channel MOS transistor.

According to the eighth embodiment of the invention, the internal node of the level converting circuit is initialized in accordance with the power-on reset signal, and thus can be accurately set to the predetermined voltage level. Further, in the normal operation mode, the internal node is set to the floating state, and the internal node can have the voltage level accurately set through capacitance coupling of the capacitance element.

The MOS transistors in the first to eighth embodiments are merely required to be field effect transistors, and may be MOS transistors formed on a semiconductor substrate or thin film transistors (TFT) formed on an insulating substrate such as glass.

According to the invention, as described above, the level converting circuit is formed of MOS transistors of the single kind, and the gate of the output drive transistor is driven through the capacitance element in accordance with the input signal. Therefore, the voltage on the source node of the output drive transistor can be outputted as the output signal of the output drive transistor independently of the voltage level of a corresponding logical level of the input signal. Accordingly, it is possible to implement the level converting circuit, which requires a decreased number of manufacturing steps, and can operate with low power consumption.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A level converting circuit having a first power supply and a second power supply for converting an input signal having an amplitude smaller than a voltage difference between voltages of the first and second power supplies to a signal at an output node changing between voltage levels corresponding to the voltages of said first and second power supplies, comprising:
    a first insulated gate field effect transistor coupled between the output node and said first power supply;
    a first capacitance element coupled between a node receiving said input signal and a gate of said first insulated gate field effect transistor;
    a first current drive element coupled between the gate of said first insulated gate field effect transistor and said first power supply; and
    a second current drive element coupled between said second power supply and said output node.

2. The level converting circuit according to claim 1, wherein
    said first power supply supplies a voltage lower than the voltage of said second power supply, said input signal has a voltage level higher than the voltage of said first power supply, and said first insulated gate field effect transistor is an N-channel insulated gate field effect transistor.

3. The level converting circuit according to claim 2, wherein
    a lower level of said input signal is a ground voltage level.

4. The level converting circuit according to claim 1, wherein
    said first power supply supplies a voltage higher than the voltage of said second power supply, and said input signal has a voltage level lower than the voltage of said first power supply; and said first insulated gate field effect transistor is a P-channel insulated gate field effect transistor.

5. The level converting circuit according to claim 1, wherein
said first current drive element is a current limiting element.

6. The level converting circuit according to claim 1, wherein
said first current drive element comprises a second insulated gate field effect transistor coupled between said first power supply and the gate of said first insulated gate field effect transistor, having a gate coupled to said output node, and being the same in conductivity type as said first insulated gate field effect transistor.

7. The level converting circuit according to claim 6, further comprising:
a current limiting element connected in parallel to said second insulated gate field effect transistor.

8. The level converting circuit according to claim 6, further comprising:
a second insulated gate field effect transistor for connecting the gate of said first insulated gate field effect transistor and said first power supply in response to a reset signal, and being the same in conductivity type as said first insulated gate field effect transistor.

9. The level converting circuit according to claim 1, wherein
said second current drive element comprises a current limiting element.

10. The level converting circuit according to claim 1, wherein
said second current drive element includes;
a second insulated gate field effect transistor coupled between said second power supply and said output node, and being the same in conductivity type as said first insulated gate field effect transistor,
a third insulated gate field effect transistor coupled between said second power supply and a gate of said second insulated gate field effect transistor, diode-connected in a forward direction from said second power supply, and being the same in conductivity type as said first insulated gate field effect transistor, and
a second capacitance element connected between said output node and the gate of said second insulated gate field-effect transistor, said output node generating a level converted signal.

11. The level converting circuit according to claim 1, wherein
said second current drive element includes;
a second insulated gate field effect transistor coupled between said second power supply and said output node, and being the same in conductivity type as said first insulated gate field effect transistor,
a third insulated gate field effect transistor coupled between said second power supply and a gate of said second insulated gate field effect transistor, diode-connected in a forward direction from said second power supply, and being the same conductivity type as said first insulated gate field effect transistor, and
a second capacitance element connected between said output node and the gate of said second insulated gate field effect transistor, and
said level converting circuit further comprises;
a fourth insulated gate field effect transistor coupled between said second power supply and a final output node, having a gate connected to the gate of said second insulated gate field effect transistor, and being the same in conductivity type as said first insulated gate field effect transistor, and
a fifth insulated gate field effect transistor coupled between said final output node and said first power supply, having a gate connected to the gate of said first insulated gate field effect transistor, and being the same in conductivity type as said first insulated gate field effect transistor, said final output node generating a level converted signal.

12. The level converting circuit according to claim 1, wherein
said second current drive element further includes:
a second insulated gate field effect transistor coupled between said second power supply and said output node, and being the same in conductivity type as said first insulated gate field effect transistor;
a third insulated gate field effect transistor coupled between said second power supply and a gate of said second insulated gate field effect transistor, diode-connected in a forward direction from said second power supply, and being the same in conductivity type as said first insulated gate field effect transistor; and
a second capacitance element connected between said output node and the gate of said second insulated gate field effect transistor, and
said level converting circuit further comprises:
a push-pull stage for driving a first internal node in accordance with a signal on said output node and a signal on the gate of said first insulated gate field effect transistor, and being the same in conductivity type as said first insulated gate field effect transistor;
an internal drive stage for driving a second internal node in accordance with a signal on said first internal node, and being formed of insulated gate field effect transistors of a common conductivity type as a conductivity type of said first insulated gate field effect transistor; and
a final output stage for driving a final output node to output a level converted signal in accordance with at least a signal on said output node and signals on the first and second internal nodes, and being formed of insulated gate field effect transistors of a common conductivity type as a conductivity type of said first insulated gate field effect transistor.

13. The level converting circuit according to claim 12, wherein
said push-pull stage includes:
a fourth insulated gate field effect transistor coupled between said first power supply node and said first internal node, having a gate coupled to the gate of said first insulated gate field effect transistor, and being the same in conductivity type as said first insulated gate field effect transistor; and
a fifth insulated gate field effect transistor coupled between said second power supply and said first internal node, having a gate connected to said output node, and being the same in conductivity type as said first insulated gate field effect transistor.

14. The level converting circuit according to claim 12, wherein
said internal drive stage includes:
a fourth insulated gate field effect transistor coupled between said second internal node and said first power supply, having a gate coupled to said first internal node, and being the same in conductivity type as said first insulated gate field effect transistor;

a fifth insulated gate field effect transistor coupled between said second power supply and said second internal node, and being the same in conductivity type as said first insulated gate field effect transistor;

a sixth insulated gate field effect transistor connected between said second power supply and a gate of said fifth insulated gate field effect transistor, diode-connected in a forward direction from said second power supply, and being the same in conductivity type as said first insulated gate field effect transistor; and a second capacitance element connected between said second internal node and the gate of said fifth insulated gate field effect transistor.

15. The level converting circuit according to claim 12, wherein said final output stage includes:

a fourth insulated gate field effect transistor coupled between a third internal node and said first power supply, having a gate coupled to said final output node, and being the same in conductivity type as said first insulated gate field effect transistor;

a sixth insulated gate field effect transistor coupled between a fourth internal node and said first power supply, having a gate connected to a third internal node, and being the same in conductivity type as said first insulated gate field effect transistor;

a seventh insulated gate field effect transistor coupled between said fourth internal node and said second power supply, having a gate connected to a fifth internal node, and being the same in conductivity type as said first insulated gate field effect transistor;

a third capacitance element connected between said fourth internal node and said fifth internal node, an eighth insulated gate field effect transistor coupled between said fifth internal node and said first power supply, having a gate connected to said first internal node, and being the same in conductivity type as said first insulated gate field effect transistor;

a ninth insulated gate field effect transistor coupled between said fifth internal node and said second power supply, having a gate connected to said second internal node, and being the same in conductivity type as said first insulated gate field effect transistor;

a tenth insulated gate field effect transistor coupled between said final output node and said first power supply, having a gate connected to said first internal node, and being the same in conductivity type as said first insulated gate field effect transistor; and an eleventh insulated gate field effect transistor coupled between said final output node and said second power supply, having a gate connected to said fifth internal node, and being the same in conductivity type as said first insulated gate field effect transistor.

* * * * *